United States Patent
Stark

(10) Patent No.: US 7,238,546 B2
(45) Date of Patent: *Jul. 3, 2007

(54) HERMETICALLY SEALED MICRO-DEVICE PACKAGE WITH WINDOW

(76) Inventor: David H. Stark, 1999 Interlocken Dr., Evergreen, CO (US) 80439

( * ) Notice: Subject to any disclaimer, the term of this patent is extended or adjusted under 35 U.S.C. 154(b) by 0 days.

This patent is subject to a terminal disclaimer.

(21) Appl. No.: 10/880,166

(22) Filed: Jun. 29, 2004

(65) Prior Publication Data

US 2005/0067179 A1 Mar. 31, 2005

Related U.S. Application Data

(63) Continuation of application No. 10/630,291, filed on Jul. 30, 2003, now Pat. No. 6,759,590, which is a continuation of application No. 10/104,315, filed on Mar. 22, 2002, now Pat. No. 6,627,814.

(51) Int. Cl.
*H01L 21/00* (2006.01)
(52) U.S. Cl. .................................. 438/106; 438/116
(58) Field of Classification Search ............... 174/52.3, 174/52.4; 257/680, 704, 681; 29/592.1; 438/106, 116
See application file for complete search history.

(56) References Cited

U.S. PATENT DOCUMENTS

| 3,698,878 A | 10/1972 | Hale et al. |
| 4,016,644 A | 4/1977 | Kurtz |
| 4,261,086 A | 4/1981 | Giachino et al. |
| 4,355,323 A | 10/1982 | Kock |
| 4,427,123 A | 1/1984 | Komeda et al. |
| 5,115,299 A * | 5/1992 | Wright .................. 257/668 |

(Continued)

OTHER PUBLICATIONS

Kazakov, N.F. (ed.); Diffusion Bonding of Materials; 1981; pp. 4-304; Pergamon Press; U.S.A.

(Continued)

*Primary Examiner*—Hung V. Ngo
(74) *Attorney, Agent, or Firm*—Howison & Arnott, L.L.P.

(57) ABSTRACT

A method for manufacturing a cover assembly including a transparent window portion and a frame of gas-impervious material that can be hermetically attached to a micro-device package base to form a hermetically sealed micro-device package. First, a frame of gas-impervious material is provided, the frame having a continuous sidewall defining a frame aperture there through. The sidewall includes a frame seal-ring area circumscribing the frame aperture. A sheet of a transparent material is also provided, the sheet having a window portion defined thereupon. The window portion has finished top and bottom surfaces. A sheet seal-ring area is prepared on the sheet, the sheet seal-ring area circumscribing the window portion. The frame is positioned against the sheet such that at least a portion of the frame seal-ring area and at least a portion of the sheet seal-ring area contact one another along a continuous junction region that circumscribes the window portion. The frame is pressed against the sheet with sufficient force to produce a predetermined contact pressure between the frame seal-ring area and the sheet seal-ring area along the junction region. The junction region is heated to produce a predetermined temperature along the junction region. The predetermined contact pressure and the predetermined temperature are maintained until a diffusion bond is formed between the frame and sheet all along the junction region.

15 Claims, 13 Drawing Sheets

U.S. PATENT DOCUMENTS

| | | | |
|---|---|---|---|
| 5,118,924 | A | 6/1992 | Mehra et al. |
| 5,157,893 | A | 10/1992 | Benson et al. |
| 5,175,975 | A | 1/1993 | Benson et al. |
| 5,302,414 | A | 4/1994 | Alkhimov et al. |
| 5,423,119 | A | 6/1995 | Yang |
| 5,625,222 | A | 4/1997 | Yoneda et al. |
| 5,719,979 | A * | 2/1998 | Furuyama ................. 385/89 |
| 5,846,638 | A | 12/1998 | Meissner |
| 5,856,914 | A | 1/1999 | O'Boyle |
| 5,920,463 | A * | 7/1999 | Thomas et al. ............. 361/760 |
| 5,945,721 | A | 8/1999 | Tatoh |
| 5,949,655 | A | 9/1999 | Glenn |
| 6,020,628 | A | 2/2000 | Mravic et al. |
| 6,139,913 | A | 10/2000 | Van Steenkiste et al. |
| 6,141,925 | A | 11/2000 | Halvorson, Jr. et al. |
| 6,168,040 | B1 | 1/2001 | Sautner et al. |
| 6,191,359 | B1 | 2/2001 | Sengupta et al. |
| 6,521,988 | B2 | 2/2003 | Hauser et al. |
| 6,537,121 | B1 | 3/2003 | Baret |
| 6,538,312 | B1 * | 3/2003 | Peterson et al. ............ 257/680 |
| 6,548,895 | B1 | 4/2003 | Benavides et al. |
| 6,627,814 | B1 | 9/2003 | Stark |
| 6,639,313 | B1 | 10/2003 | Martin et al. |
| 6,653,724 | B1 | 11/2003 | Kim et al. |
| 6,656,768 | B2 | 12/2003 | Thomas |
| 6,668,500 | B1 | 12/2003 | Lamberts |
| 6,696,849 | B2 | 2/2004 | Ban et al. |
| 6,723,379 | B2 | 4/2004 | Stark |
| 6,736,295 | B2 | 5/2004 | Lin et al. |
| 6,759,590 | B2 | 7/2004 | Stark |
| 6,763,638 | B1 | 7/2004 | Berger, Jr. |
| 2004/0104460 | A1 | 6/2004 | Stark |
| 2004/0161530 | A1 | 8/2004 | Stark |
| 2004/0187437 | A1 | 9/2004 | Stark |
| 2004/0188124 | A1 | 9/2004 | Stark |

OTHER PUBLICATIONS

Dunkerton; TWI Knowledge Summary Diffusion bonding: Copyright 2001; TWI World Centre for Materials Joining Technology Website; www.twi.co.uk; United Kingdom; 4 pages.

PCT; International Search Report of PCT/US04/02272 (related application); International Publication No. WO 2004/068189; Jan. 27, 2004; 3 pages.

Daron Teomim, Avner Badihi, Gil Zilber; "An innovative approach to wafer-level MEMS packaging"; Solid State Technology (Magazine); Jan. 2002; Penwell (Publ.); Nashua, NH USA.

Carpenter Specialty Alloys: Controlled-Expansion Alloys (Catalog/Brochure); Dec. 1999; pp. 1-24 (esp. 5-8); Carpenter Technology Corporation (Publ.); Wyomissing, PA USA.

JPL Technololgy Reporting Office; "Hermetic Wafer Bonding By Use of Microwave Heating"; NASA Tech Brief, vol. 25, No. 5, from JPL New Technology Report NPO-20608 (NASA Contract No. NAS-7-918); May 1, 2001; Jet Propulsion Laboratory, California Institute of Technology (Publ.); Pasadena, CA, USA; including therein: NTR Inventors Report by Henry W Jackwon, John D Mai, Martin B Barmatz, Nasser K Budraa, William T Pike; NASA Case No. 0205 20608; Mar. 1997 (?) (Best Available Copy); including therein: (same authors) "Low Pressure and Low Temperature Hermetic Wafer Bonding Using Microwave Heating"; Jet Propulsion Laboratory California Institute of Technology; Pasadena CA USA (Best Available Copy).

George S. Bradey, et al., Materials Handbook, 12th Edition; 1986; pp. 28-29; McGraw-Hill Book Company; New York.

R.C. Dykhuizen et al.; Gas Dynamic Principles of Cold Spray; Journal of Thermal Spray Technology; vol. 7(2); pp. 205-212; Jun. 1998.

Kazakov, N.F. (ed.); Diffusion Bonding of Materials; 1981; pp. 4-9, 248-257; Pergamon Press; U.S.A.

Nicholas M G & Lee R.J., Joining Dissimilar Materials Metals and Materials the journal of the Institute of Metals, vol. 5, No. 6, Jun. 1989, UK.

Cerjak, H. (ed.), Mathematical Modelling of Weld Phenomena 5; Diffusion Bonding of Glass to Metal in an Electrostatic Field; M. Morsy et al.; pp. 945-959; London IOM Communications, 2001.

Ostyn, K. & Vinckier, A.: Joining of Different Materials Through interfaces; interfaces in Materials, Proceedings of the Collequium; pp. 153-173; Brussals, Dec. 1988.

Arata et al. Pressure and Field Assisted Bonding of Glass to Aluminium; Transactions of JWRI is published by Welding Research Institute of Osaka University; vol. 13; No. 1; 1984; pp. 35-40.

Sadpysky et al.; Precision Welding of Glass to Kovar Without Melting; Svarochnoe Proizvodstvo; Feb. 1973; pp. 22; (In Russian, English translation provided).

Kazakov et al.; Equipment for Diffusion Welding of Rectangular Glass Plates to Kovar; Svarochnoe Proizvodstvo; Jun. 1977; p. 50; (In Russian, English translation provided).

PCT; International Search Report of PCT/US03/07553 (related application); International Publication No. WO 03/083938 A1; Jun. 16, 2003; 2 pg.

\* cited by examiner

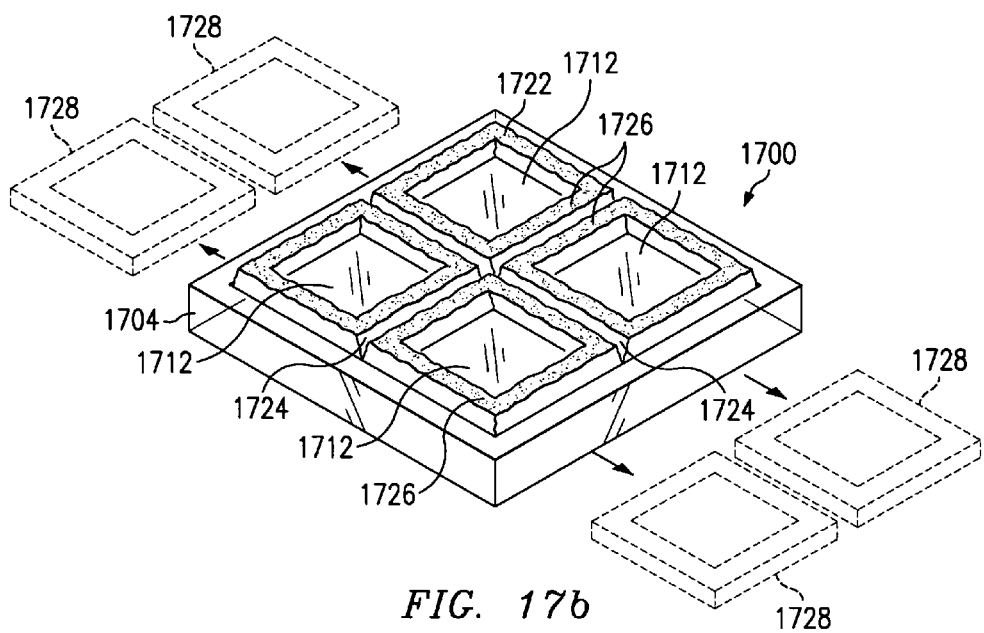
FIG. 17b
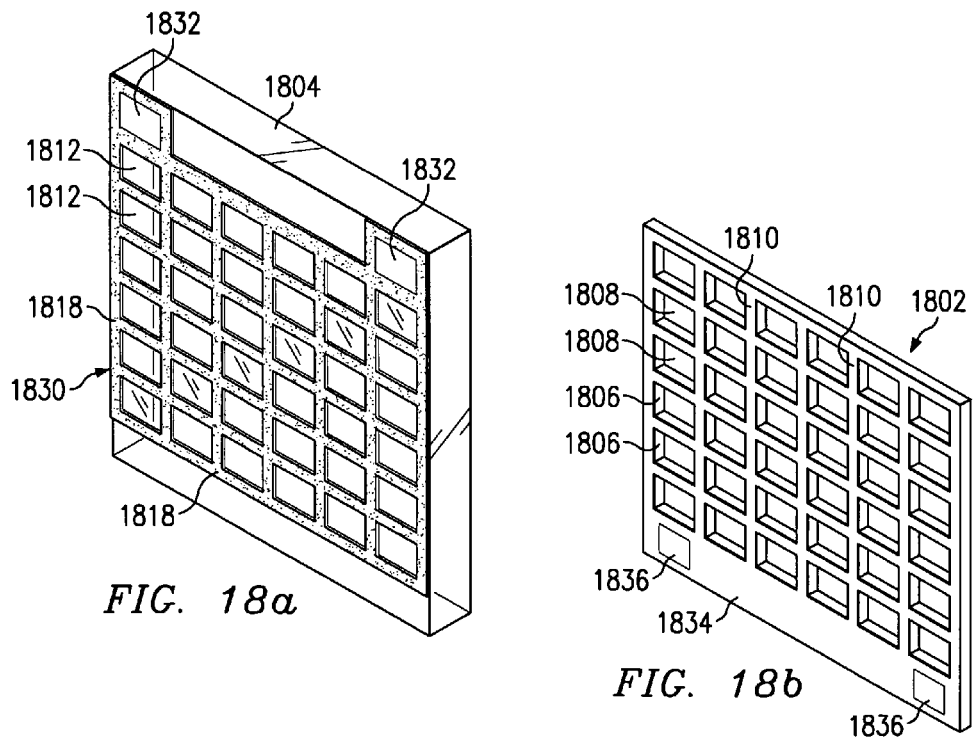
FIG. 18a
FIG. 18b

HERMETICALLY SEALED MICRO-DEVICE PACKAGE WITH WINDOW

CROSS-REFERENCE TO RELATED APPLICATIONS

This application is a Continuation of pending U.S. patent application Ser. No. 10/630,291, entitled "HERMETICALLY SEALED MICRO-DEVICE PACKAGE WITH WINDOW," filed Jul. 30, 2003, now U.S. Pat. No. 6,759,590 issued Jul. 6, 2004, which is a Continuation of U.S. patent application Ser. No. 10/104,315, entitled "HERMETICALLY SEALED MICRO-DEVICE PACKAGE WITH WINDOW," filed Mar. 22, 2002, now U.S. Pat. No. 6,627,814 issued Sep. 30, 2003.

TECHNICAL FIELD OF THE INVENTION

The current invention relates to packages for photonic devices, optical devices, micro-mechanical devices, micro-electromechanical systems (MEMS) devices or micro-opto-electromechanical systems (MOEMS) devices, and more particularly, to packages having a hermetically sealed chamber covered by a transparent window.

BACKGROUND OF THE INVENTION

Photonic, optical and micro-mechanical devices are typically packaged such that the active elements (i.e., the emitters, receivers, micro-mirrors, etc.) are disposed within a sealed chamber to protect them from handling and other environmental hazards. In many cases, it is preferred that the chamber be hermetically sealed to prevent the influx, egress or exchange of gasses between the chamber and the environment. Of course, a window must be provided to allow light or other electromagnetic energy of the desired wavelength to enter and/or leave the package. In some cases, the window will be visibly transparent, e.g. if visible light is involved, but in other cases the window may be visibly opaque while still being "optically" transparent to electromagnetic energy of the desired wavelengths. In many cases, the window is given certain optical properties to enhance the performance of the device. For example, a glass window may be ground and polished to achieve certain flatness specifications in order to avoid distorting the light passing therethrough. In other cases, anti-reflective or anti-refractive coatings may be applied to the window to improve light transmission therethrough.

Hermetically sealed micro-device packages with windows have heretofore been produced using cover assemblies with metal frames and glass window panes. To achieve the required hermetic seal, the glass window pane has heretofore been fused to its metallic frame by heating it in a furnace at a temperature exceeding the glass transition temperature, $T_G$ (typically at or above 900° C.). However, because the fusing temperature is above $T_G$, the original surface finish of the glass pane is typically ruined, making it necessary to finish or re-finish (e.g., grinding and polishing) both surfaces of the window pane after fusing in order to obtain the necessary optical characteristics. This polishing of the window panes requires additional process steps during manufacture of the cover assemblies, which steps tend to be relatively time and labor intensive, thus adding significantly to the cost of the cover assembly, and hence to the cost of the overall package. In addition, the need to polish both sides of the glass after fusing requires the glass to project both above and below the attached frame. This restricts the design options for the cover assembly with respect to glass thickness, dimensions, etc., which can also result in increased material costs.

Once a cover assembly with a hermetically sealed window is prepared, it is typically seam welded to the device base (i.e., substrate) in order to produce the finished hermetically sealed package. Seam welding uses a precisely applied AC current to produce localized temperatures of about 1,100° C. at the frame/base junction, thereby welding the metallic cover assembly to the package base and forming a hermetic seal. To prevent distortion of the glass windowpane or package, the metal frame of the cover assembly should be fabricated from Kovar alloy or another alloy having a CTE (i.e., coefficient of thermal expansion) which is similar to that of the transparent window material and to the CTE of the package base.

While the methods described above have heretofore produced useable window assemblies for hermetically sealed micro-device packages, the relatively high cost of these window assemblies is a significant obstacle to their widespread application. A need therefore exists, for package and component designs and assembly methods which reduce the labor costs associated with producing each package.

A need still further exists for package and component designs and assembly methods which will minimize the manufacturing cycle time required to produce a completed package.

A need still further exists for package and component designs and assembly methods which reduce the number of process steps required for the production of each package. It will be appreciated that reducing the number of process steps will reduce the overhead/floor space required in the production facility, the amount of capital equipment necessary for manufacturing, and handling costs associated with transferring the work pieces between various steps in the process. A reduction in the cost of labor may also result. Such reductions would, of course, further reduce the cost of producing these hermetic packages.

A need still further exists for package and component designs and assembly methods which will reduce the overall materials costs associated with each package, either by reducing the initial material cost, by reducing the amount of wastage or loss during production, or both.

SUMMARY OF THE INVENTION

The present invention disclosed and claimed herein comprises, in one aspect thereof, a method for manufacturing a cover assembly including a transparent window portion and a frame of gas-impervious material that can be hermetically attached to a micro-device package base to form a hermetically sealed micro-device package. First, a frame of gas-impervious material is provided, the frame having a continuous sidewall defining a frame aperture there through. The sidewall includes a frame seal-ring area circumscribing the frame aperture. A sheet of a transparent material is also provided, the sheet having a window portion defined thereupon. The window portion has finished top and bottom surfaces. A sheet seal-ring area is prepared on the sheet, the sheet seal-ring area circumscribing the window portion. The frame is positioned against the sheet such that at least a portion of the frame seal-ring area and at least a portion of the sheet seal-ring area contact one another along a continuous junction region that circumscribes the window portion. The frame is pressed against the sheet with sufficient force to produce a predetermined contact pressure between the frame seal-ring area and the sheet seal-ring area along the junction region. The junction region is heated to produce a predetermined temperature all along the junction region. The predetermined contact pressure and the predetermined temperature are maintained until a diffusion bond is formed between the frame and sheet all along the junction region.

The present invention disclosed and claimed herein comprises, in another aspect thereof, a cover assembly including a transparent window portion and a frame that can be joined to a micro-device package base to form a hermetically sealed micro-device package.

The present invention disclosed and claimed herein comprises, in yet another aspect thereof, a micro-device module including a package base, micro-device mounted on the package base, and a cover assembly having a transparent window portion and a frame, the cover assembly being hermetically joined to the package base to hermetically seal the micro-device within a cavity formed there between.

BRIEF DESCRIPTION OF TH E DRAWINGS

Figure 4A:
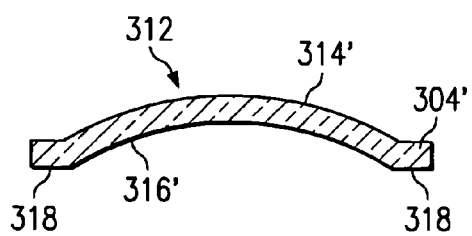
FIGS. 4a and 4b show transparent sheets having contoured sides, specifically.
Figure 4B:
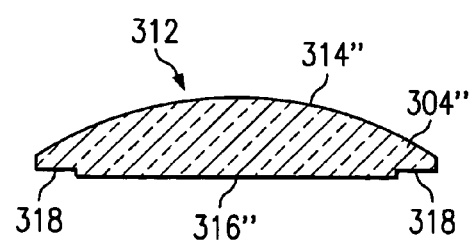
Figure 5:
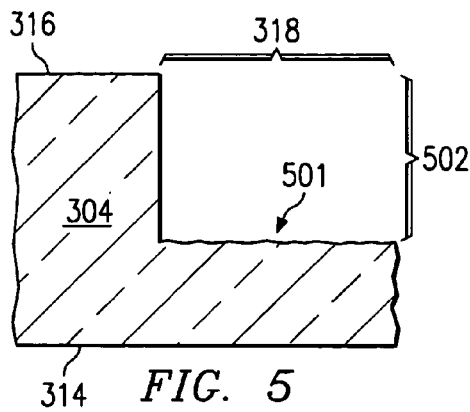
Figure 6:
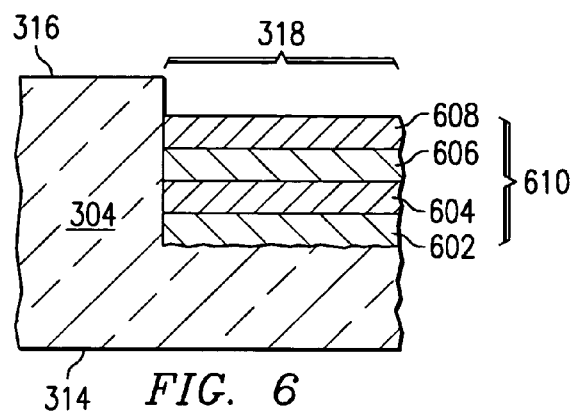
Figure 7:
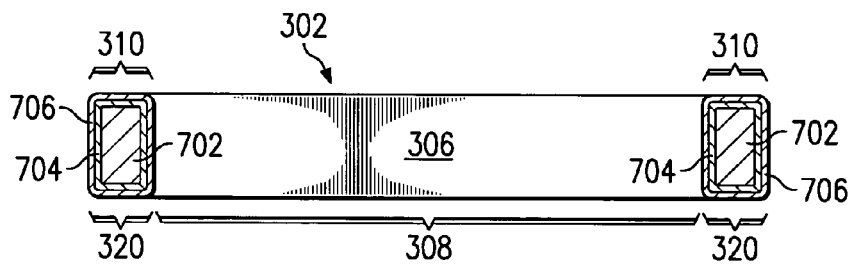
Figure 8:
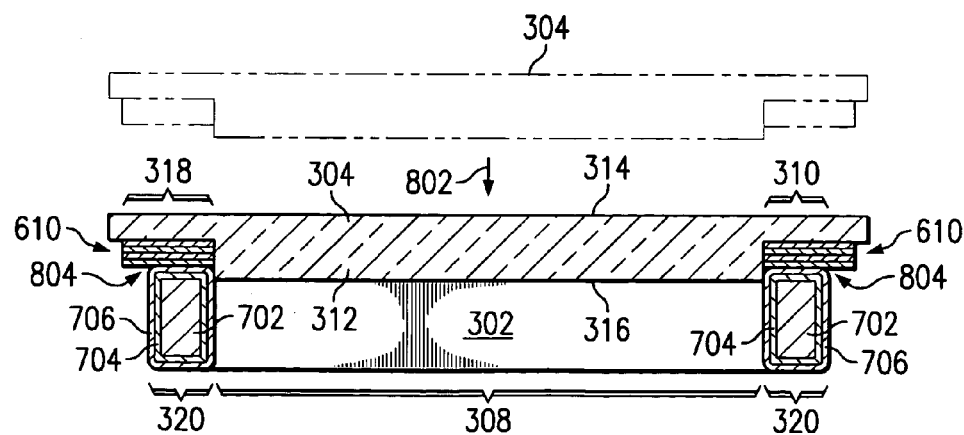
Figure 9:
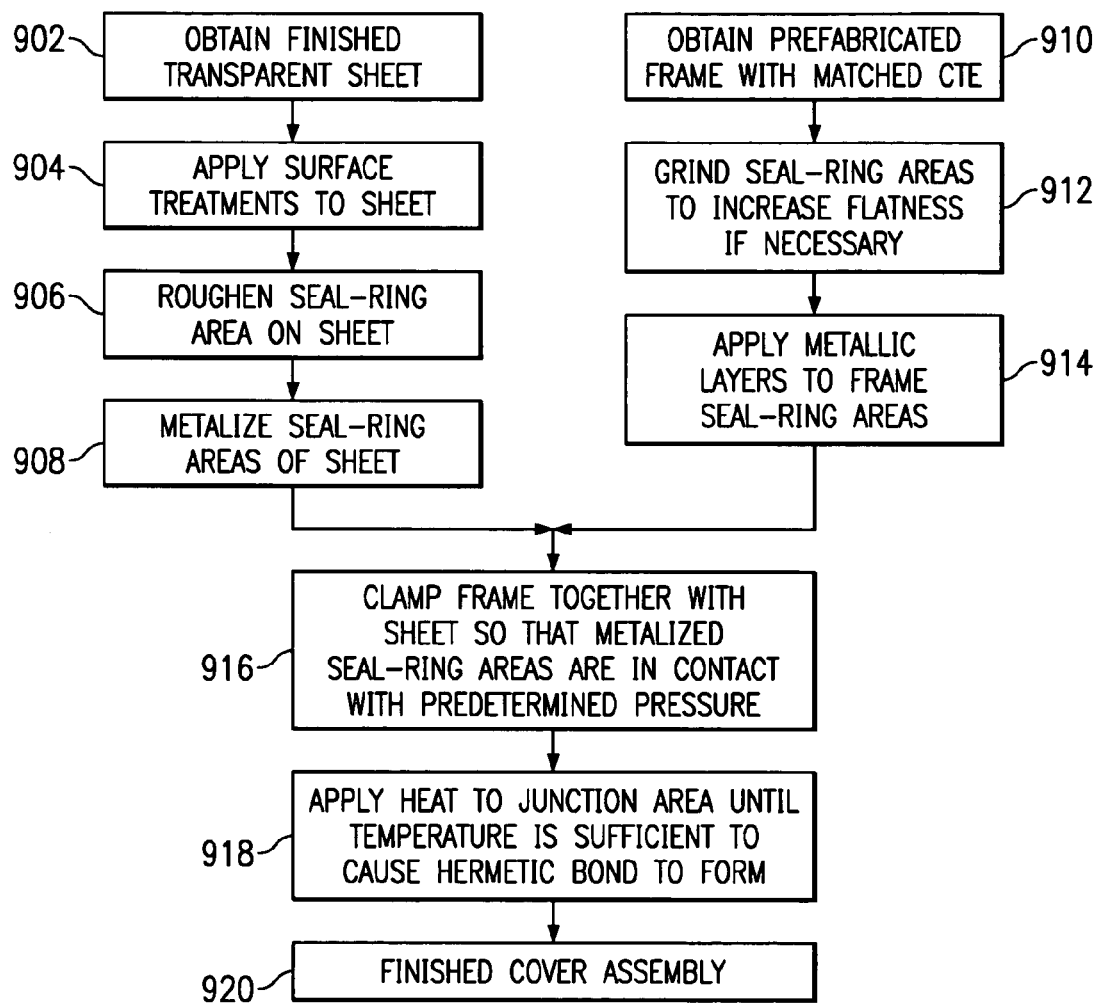
Figure 10:
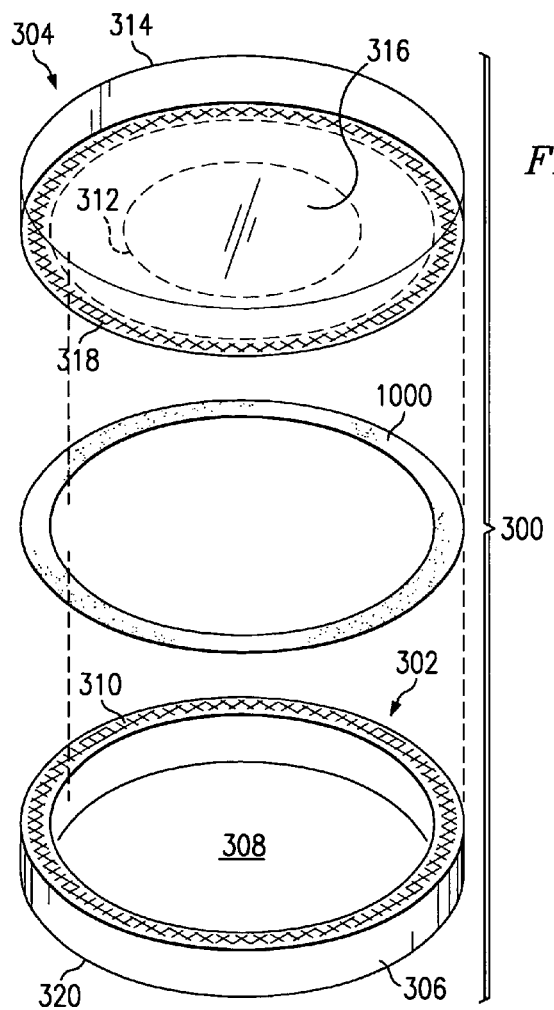
Figure 11:
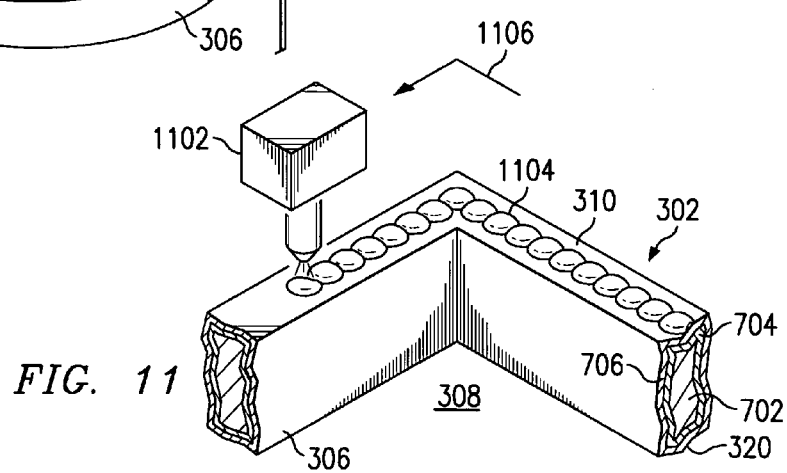
Figure 12A:
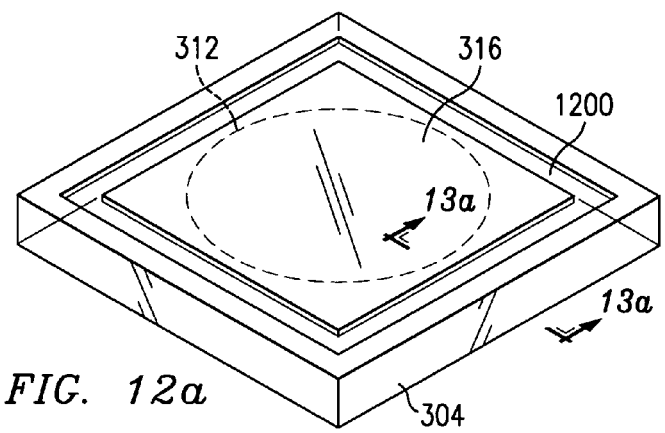
Figure 12B:
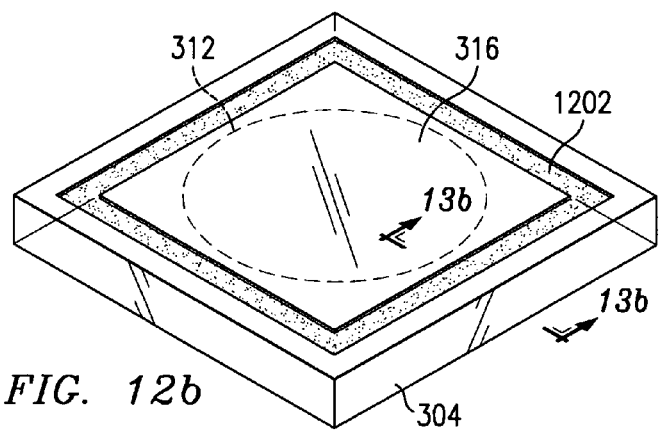
Figure 12C:
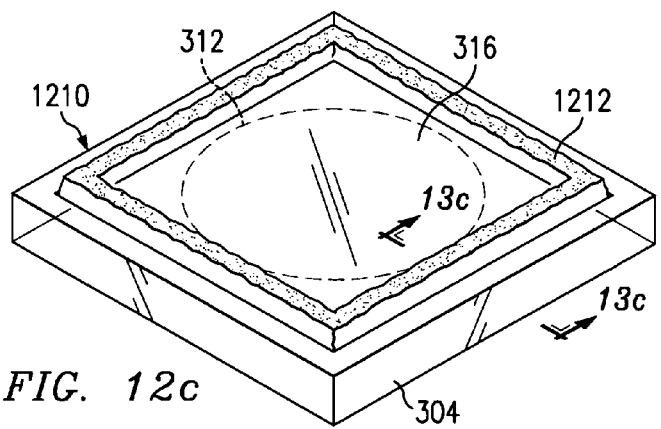
Figure 13A:
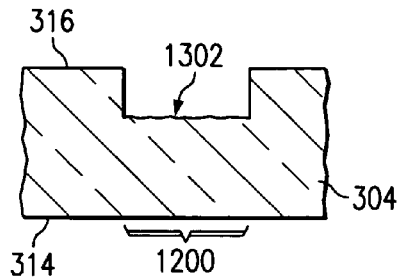
Figure 13B:
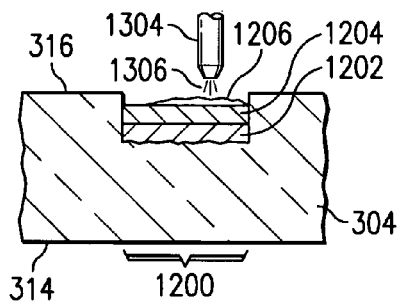
Figure 13C:
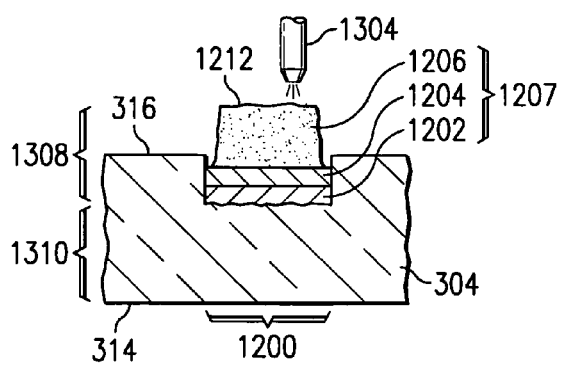
Figure 14:
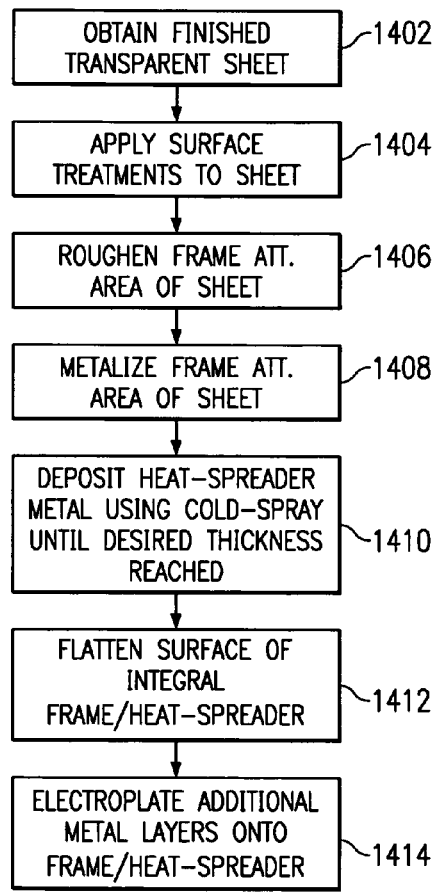
Figure 15A:
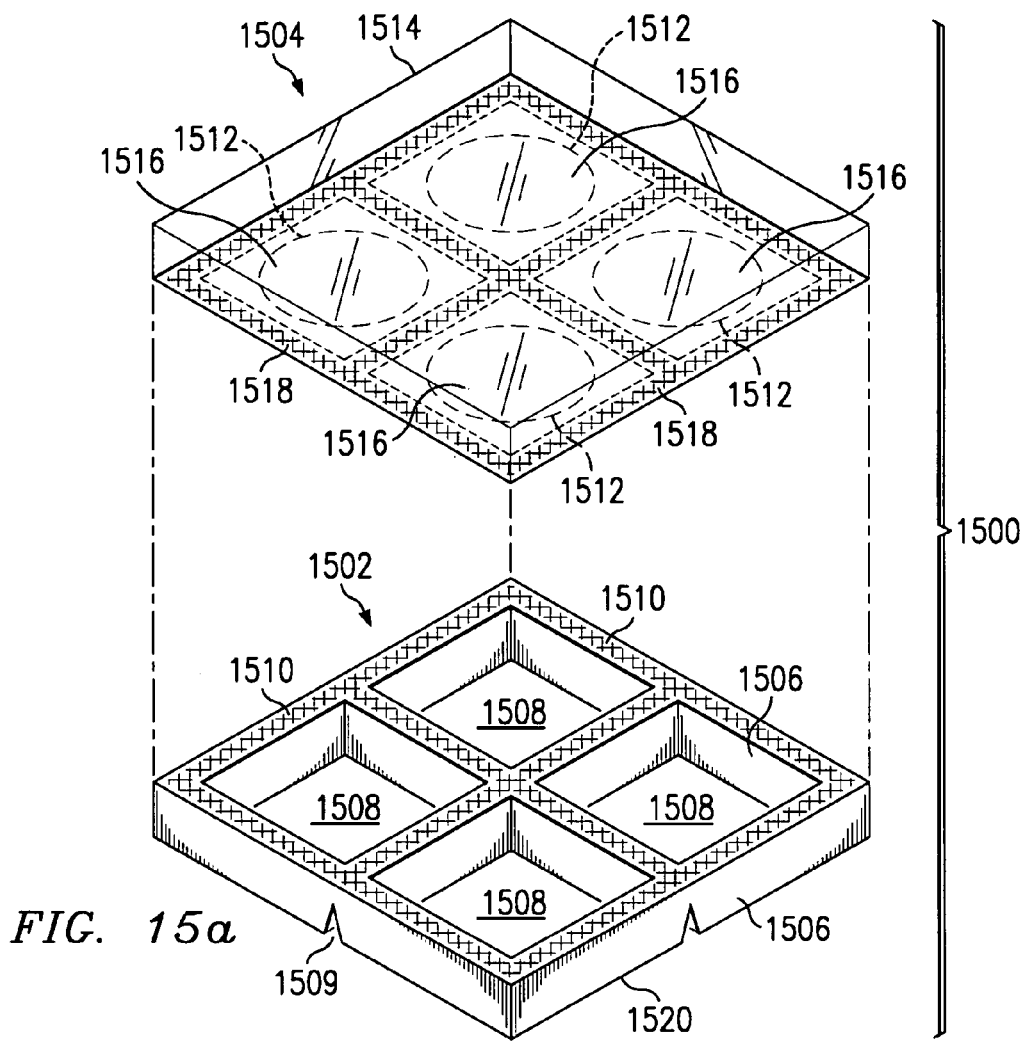
Figure 15B:
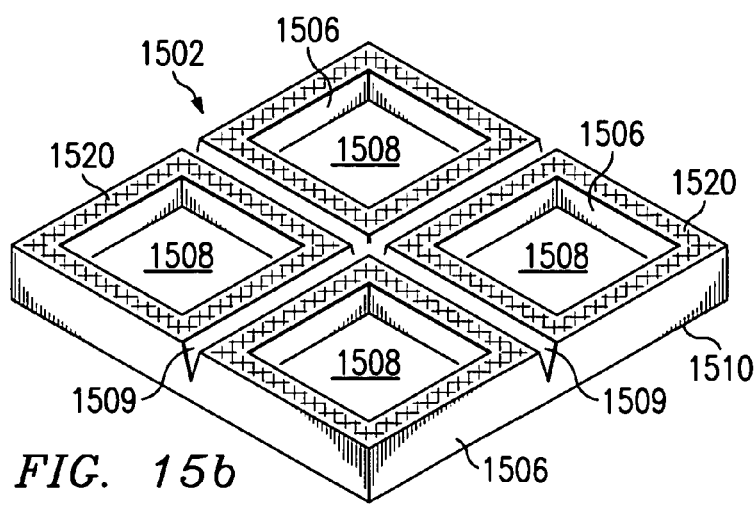
Figure 16A:
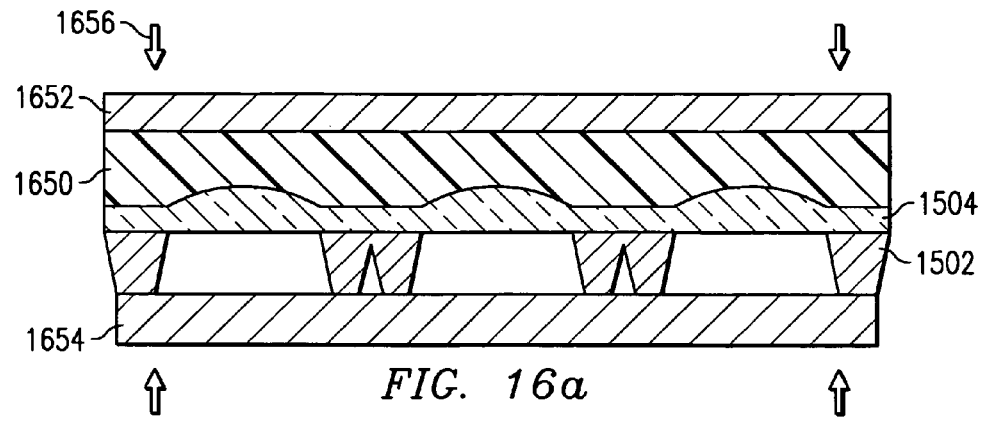
Figure 16B:
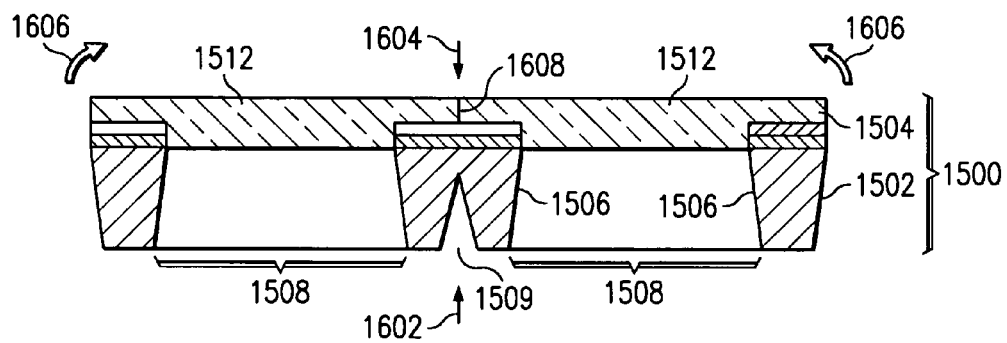
Figure 17A:
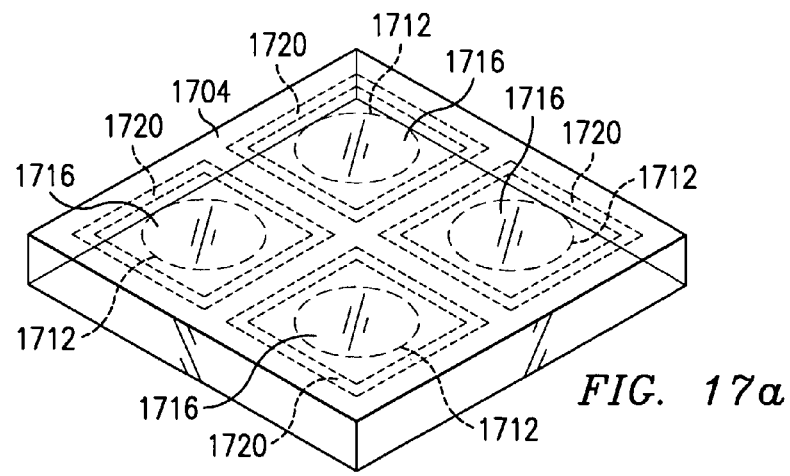
Figure 18C:
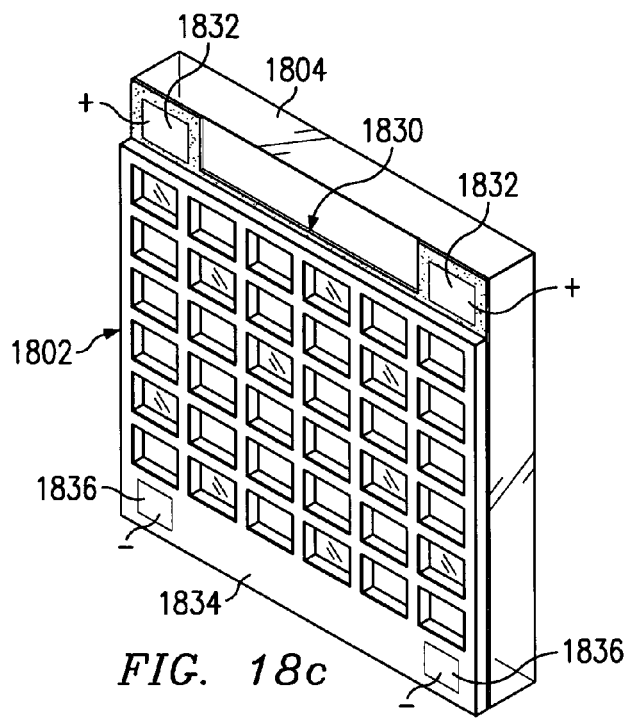

FIG. 4a showing a sheet having both sides contoured;

FIG. 4b showing a sheet having one side contoured;

FIG. 5 shows an enlarged view of the sheet seal-ring area prior to metalization;

FIG. 6 shows an enlarged view of the sheet seal-ring area after metalization;

FIG. 7 shows a cross-sectional view through a prefabricated frame;

FIG. 8 illustrates placing the frame against the metallized sheet prior to bonding;

FIG. 9 is a block diagram of a process for manufacturing cover assemblies using prefabricated frames in accordance with one embodiment;

FIG. 10 is an exploded view of a cover assembly manufactured using a solder preform;

FIG. 11 is a partial perspective view of another embodiment utilizing solder applied by ink-jet;

FIGS. 12a-c and FIGS. 13a-c illustrate a process of manufacturing cover assemblies in accordance with yet another embodiment of the invention, specifically:

FIG. 12a shows the initial transparent sheet;

FIG. 12b shows the transparent sheet after initial metallization;

FIG. 12c shows the transparent sheet after deposition of the integral frame/heat spreader;

FIG. 13a shows a partial cross-section of the sheet of FIG. 12a;

FIG. 13b shows a partial cross-section of the sheet of FIG. 12b;

FIG. 13c shows a partial cross-section of the sheet of FIG. 12c;

FIG. 14 is a block diagram of a process for manufacturing cover assemblies using cold gas dynamic spray technology in accordance with another embodiment;

FIGS. 15a-15b illustrate a multi-unit assembly manufactured in accordance with another embodiment; specifically:

FIG. 15a illustrates an exploded view of a the multi-unit assembly;

FIG. 15b is bottom view of the frame of FIG. 15a;

FIG. 16a illustrates compliant tooling formed in accordance with another embodiment;

FIG. 16b is a side view of a multi-unit assembly illustrating the method of separation;

FIGS. 17a and 17b illustrate the manufacture of multiple cover assemblies in accordance with yet another embodiment, specifically:

FIG. 17a shows the transparent sheet in its original state;

FIG. 17b illustrates the sheet after deposition of the multi-aperture frame/heat spreader;

FIGS. 18a-8c illustrate an assembly configuration suitable for use with electrical resistance heating; specifically:

FIG. 18a illustrates the configuration of the sheet;

FIG. 18b illustrates the configuration of the frame;

FIG. 18c illustrates the joined sheet and frame; and

FIGS. 19a-19f illustrate multi-unit assembly configurations suitable for heating with electrical resistance heating.

DETAILED DESCRIPTION OF THE INVENTION AND BEST MODE

Figure 1:
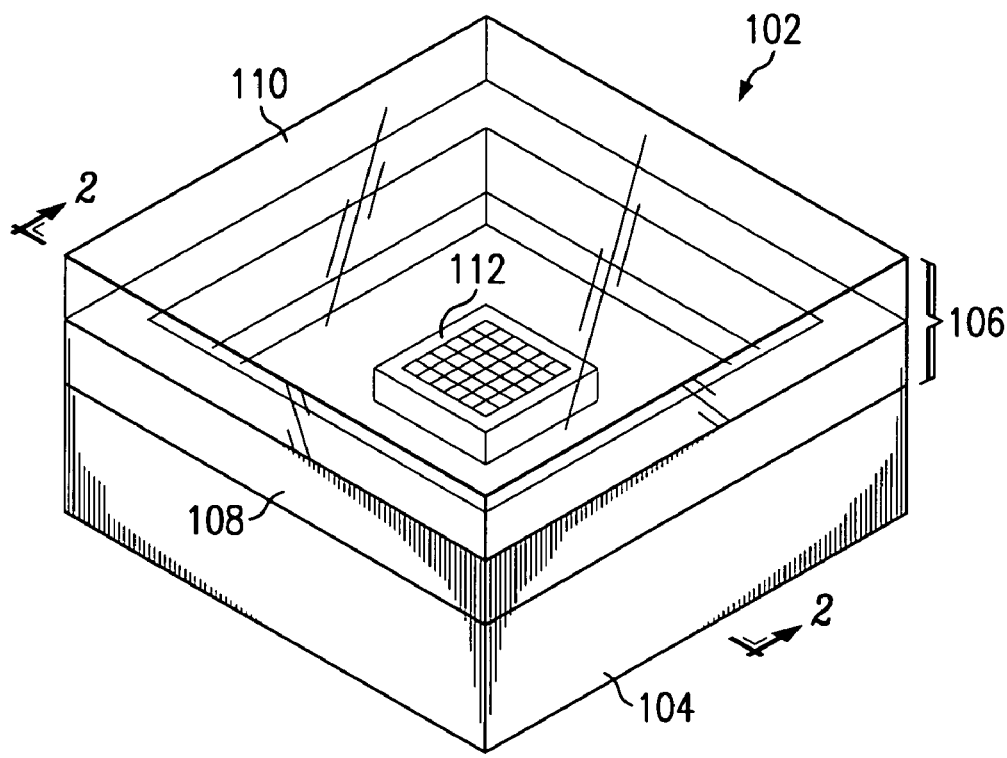
FIG. 1 is a perspective view of a hermetically sealed micro-device package.
Figure 2:
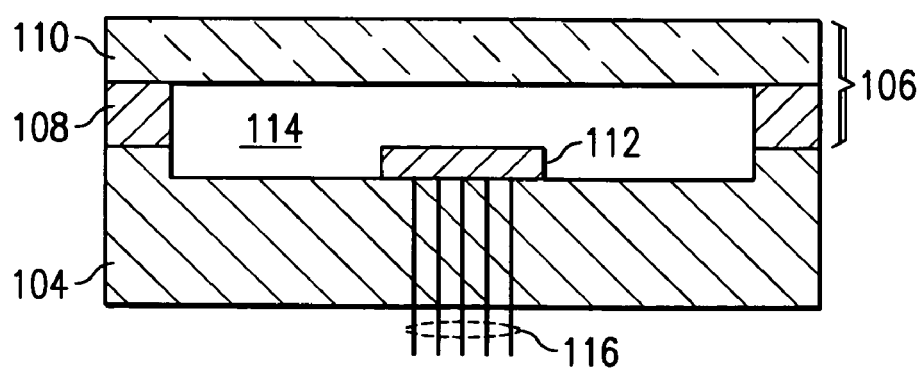
FIG. 2 is a cross-sectional view of the micro-device package of FIG. 1.

Referring now to FIGS. 1 and 2, there is illustrated a typical hermetically sealed micro-device package for housing photonic devices, optical devices (i.e., including reflective, refractive and diffractive type devices), micro-optoelectromechanical systems (i.e., MOEMS) devices and micro-electromechanical systems (i.e., MEMs) devices. The package 102 comprises a base or substrate 104 which is hermetically sealed to a cover assembly 106 comprising a frame 108 and a transparent window 110. A micro-device 112 mounted on the base 104 is encapsulated within a cavity 114 when the cover assembly 106 is joined to the base 104. One or more electrical leads 116 may pass through the base 104 to carry power, ground, and signals to and from the micro-device 112 inside the package 102. It will be appreciated that the electrical leads 116 must also be hermetically sealed to maintain the integrity of the package 102. The window 110 is formed of an optically or electro-magnetically transparent material. For purposes of this application, the term "transparent" refers to materials which allow the transmission of electromagnetic radiation having predetermined wavelengths, including, but not limited to, visible light, infrared light, ultraviolet light, microwaves, radio waves, or x-rays. The frame 108 is formed from a material, typically a metal alloy, which preferably has a CTE close to that of both the window 110 and the package base 104.

Figure 3:
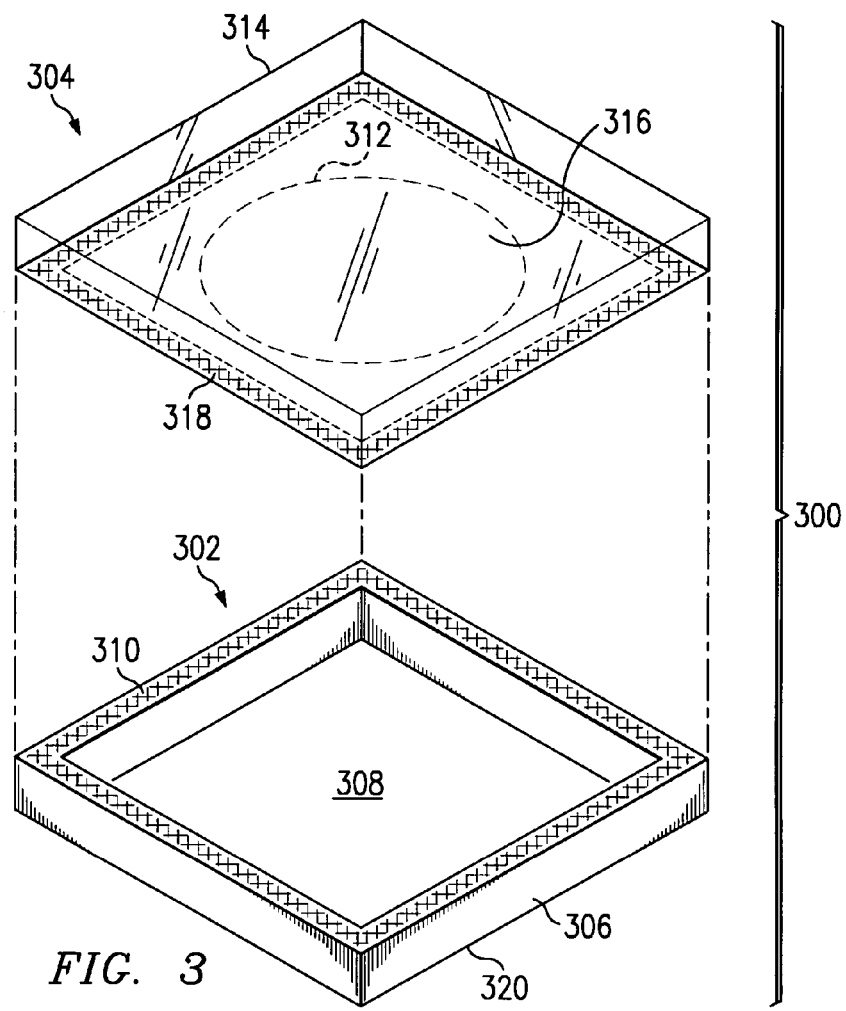
FIG. 3 is an exploded view of a cover assembly manufactured in accordance with one embodiment of the current invention.

Referring now to FIG. 3, there is illustrated an exploded view of a cover assembly manufactured in accordance with one embodiment of the current invention. The cover assembly 300 includes a frame 302 and a sheet 304 of a transparent material. The frame 302 has a continuous sidewall 306 which defines a frame aperture 308 passing therethrough. The frame sidewall 306 includes a frame seal-ring area 310 (denoted by crosshatching) circumscribing the frame aperture 308. Since the frame 302 will eventually be welded to the package base 104, it is usually formed of a weldable metal or alloy, preferably one having a CTE very close to that of the micro-device package base 104. In some embodiments, however, the cover assembly frame 304 may be formed of a non-metallic material such as ceramic or alumina. Regardless of whether the frame 302 is formed of a metallic or non-metallic material, the surface of the frame seal-ring area 310 must be metallic (e.g., metal plated if not solid metal) to facilitate the hermetic sealing of the sheet 304 to the frame. In a preferred embodiment, the frame is primarily formed of an alloy having a nominal chemical composition of 54% iron (Fe), 29% nickel (Ni) and 17% cobalt (Co). Such alloys are also known by the designation ASTM F-15 alloy and by the trade name Kovar Alloy. As used in this application, the term "Kovar Alloy" will be understood to mean the alloy having the chemical composition just described. In embodiments where a Kovar Alloy frame 302 is used, it is preferred that the surface of the frame seal-ring area 310 have a surface layer of gold (Au) overlying a layer of nickel (Ni). The frame 302 also includes a base seal area 320 which is adapted for eventual joining, typically by welding, to the package base 104. The base seal area 320 frequently includes a layer of nickel overlaid by a layer of gold to facilitate seam welding to the package base. Although the gold over nickel surface layers are only required along the base seal-ring area 320, it will be appreciated that in many cases, for example, where solution bath plating is used to apply the surface materials, the gold over nickel layers may be applied to the entire surface of the frame 302. The sheet 304 can be any type of transparent material, for example, soft glass (e.g., soda-lime glass), hard glass (e.g. borosilicate glass), crystalline materials such as quartz and sapphire, or polymeric materials such as polycarbonate plastic. As previously discussed, it is preferred that the material of the sheet 304 have a CTE that is similar to that of the frame 304 and of the package base 104 to which the cover assembly will eventually be attached. For many semiconductor photonic, MEMS or MOEMS applications, a borosilicate glass is well suited for the material of the sheet 304. Examples of suitable glasses include Corning 7052, 7050, 7055, 7056, 7058, 7062, Kimble (Owens Corning) EN-1, and Kimble K650 and K704. Other suitable glasses include Abrisa soda-lime glass, Schott 8245 and Ohara Corporation S-LAM60.

The sheet 304 has a window portion 312 defined thereupon, i.e., this is the portion of the sheet 302 which must remain transparent to allow for the proper functioning of the encapsulated, i.e., packaged, micro-device 112. The window portion 312 of the sheet has top and bottom surfaces 314 and 316, respectively, that are optically finished in the preferred embodiment. The sheet 304 is preferably obtained with the top and bottom surfaces 314 and 316 of the window portion 312 in ready to use form, however, if necessary the material may be ground and polished or otherwise shaped to the desired surface contour and finish as a preliminary step of the manufacturing process. While in many cases the window portion 312 will have top and bottom surfaces of 314 and 316 that are optically flat and parallel to one another, it will be appreciated that in other embodiments at least one of the finished surfaces of the window portion will be contoured. A sheet seal-ring area 318 (denoted with cross-hatching) circumscribes the window portion 312 of the sheet 304, and provides a suitable surface for joining to the front seal-ring area 310.

Referring now to FIGS. 4a and 4b, there are illustrated transparent sheets having contoured sides. In FIG. 4a, transparent sheet 304' has both a curved top side 314' and a curved bottom side 316' producing a window portion 312 having a curved contour with a constant thickness. In FIG. 4b, sheet 304" has a top side 314" which is curved and a bottom side 316" which is flat, thereby resulting in a window portion 312 having a plano-convex lens arrangement. It will be appreciated that in similar fashion (not illustrated) the finished surfaces 314 and 316 of the window portion 312 can have the configuration of a refractive lens including a plano-convex lens as previously illustrated, a double convex lens, a plano-concave lens or a double concave lens. Other surface contours may give the finished surfaces of the window portion 312 the configuration of a Fresnel lens or of a diffraction grating, i.e., "a diffractive lens."

In many applications, it is desirable that window portion 312 of the sheet 304 have enhanced optical or physical properties. To achieve these properties, surface treatments or coatings may be applied to the sheet 304 prior to or during the assembly process. For example, the sheet 304 may be treated with siliconoxynitride (SiOn) to provide a harder surface on the window material. Whether or not treated with SiOn, the sheet 304 may be coated with a scratch resistant/abrasion resistant material such as amorphous diamond-like carbon (DLC) such as that sold by Diamonex, Inc., under the name Diamond Shield®. Other coatings which may be applied in addition to, or instead of, the SiOn or diamond-like carbon include, but are not limited to, optical coatings, antireflective coatings, refractive coatings, achromatic coatings, optical filters, electromagnetic interference (EMI) and radio frequency (RF) filters of the type known for use on lenses, windows and other optical elements. It will be appreciated that the optical coatings and/or surface treatments can be applied either on the top surface 314 or the bottom surface 316, or in combination on both surfaces, of the window portion 312. It will be further appreciated, that the optical coatings and treatments just described are not illustrated in the figures due to their transparent nature.

In some applications, a visible aperture is formed around the window portion 312 of the sheet 304 by first depositing a layer of non-transparent material, e.g., chromium (Cr), over the entire surface of the sheet and then etching the non-transparent material from the desired aperture area. This procedure provides a sharply defined border to the window portion 312 which is desirable in some applications. This operation may be performed prior to or after the application of other treatments depending on the compatibility and processing economics.

The next step of the process of manufacturing the cover assembly 300 is to prepare the sheet seal-ring area 318 for metalization. The sheet seal-ring area 318 circumscribes the window portion 312 of the sheet 304, and for single aperture covers is typically disposed about the perimeter of the bottom surface 316. It will be appreciated, however, that in some embodiments the sheet seal-ring area 318 can be located in the interior portion of a sheet, for example where the sheet will be diced to form multiple cover assemblies (i.e., as described later herein). The sheet seal-ring area 318 generally has a configuration which closely matches the configuration of the frame seal-ring area 310 to which it will eventually be joined. At a minimum, preparing the sheet seal-ring area 318 involves a thorough cleaning to remove any greases, oils or other contaminants from the surface. More commonly, preparing the sheet seal-ring area 318 involves roughening the seal-ring area by chemical etching, laser ablating, mechanical grinding or sandblasting this area. This roughening increases the surface area of the sheet seal-ring, thereby providing increased adhesion for the subsequently deposited metalization materials.

Referring now to FIG. 5, there is illustrated a portion of the sheet 304 which has been placed bottom side up to better illustrate the preparation of the sheet seal-ring area 318. In this example the seal-ring area 318 has been given a roughened surface 501 to improve adhesion of the metallic layers to be applied. Chemical etching to roughen glass and similar transparent materials is well known. Alternatively, laser ablating, conventional mechanical grinding or sandblasting may be used. A grinding wheel with 325 grit is believed suitable for most glass materials, while a diamond grinding wheel may be used for sapphire and other hardened materials. The depth 502 to which the roughened surface 501 of the sheet seal-ring area 318 penetrates the sheet 304 is dependent on at least two factors: first, the desired mounting height of the bottom surface 316 of the window relative to the package bottom and/or the micro-device 112 mounted inside the package; and second, the required thickness of the frame 306 including all of the deposited metal layers (described below). It is believed that etching or grinding the sheet seal-ring area 318 to a depth of 502 within the range from about 0 inches to about 0.05 inches will provide a satisfactory adhesion for the metallized layers as well as providing an easily detectable "lip" for locating the sheet 304 in the proper position against the frame 306 during subsequent joining operations.

It will be appreciated that it may be necessary or desirable to protect the finished surfaces 314 and/or 316 in the window portion 312 of the sheet (e.g., the portions that will be optically active in the finished cover assembly) from damage during the roughening process. If so, the surfaces 314 and/or 316 may be covered with semiconductor-grade "tacky tape" or other known masking materials prior to roughening. The mask material must, of course, be removed in areas where the etching/grinding will take place. Sandblasting is probably the most economical method of selectively removing strips of tape or masking material in the regions that will be roughened. If sandblasting is used, it could simultaneously perform the tape removal operation and the roughening of the underlying sheet.

Referring now to FIG. 6, there is illustrated a view of the seal-ring area 318 of the sheet 304 after metalization. The next step of the manufacturing process is to apply one or more metallic layers to the prepared sheet seal-ring area 318. The current invention contemplates several options for accomplishing this metalization. A first option is to apply metal layers to the sheet seal-ring area 318 using conventional chemical vapor deposition (CVD) technology. CVD technology includes atmospheric pressure chemical vapor deposition (APCVD), low pressure chemical vapor deposition (LPCVD), plasma assisted (enhanced) chemical vapor deposition (PACVD, PECVD), photochemical vapor deposition (PCVD), laser chemical vapor deposition (LCVD), metal-organic chemical vapor deposition (MOCVD) and chemical beam epitaxy (CBE). A second option for metalizing the roughened seal-ring area 318 is using physical vapor deposition (PVD) technology. PVD technology includes sputtering, ion plasma assist, thermal evaporation, vacuum evaporation, and molecular beam epitaxy (MBE). A third option for metalizing the roughened sheet seal-ring area 318 is using solution bath plating technology (SBP). Solution bath plating includes electroplating, electroless plating and electrolytic plating technology. While solution bath plating cannot be used for depositing the initial metal layer onto a nonmetallic surface such as glass or plastic, it can be used for depositing subsequent layers of metal or metal alloy to the initial layer. Further, it is envisioned that in many cases, solution bath plating will be the most cost effective metal deposition technique. Since the use of chemical vapor deposition, physical vapor deposition and solution bath plating to deposit metals and metal alloys is well known, these techniques will not be further described herein.

A fourth option for metalizing the sheet seal-ring area 318 of the sheet 304 is so-called cold-gas dynamic spray technology, also known as "cold-spray". This technology involves the spraying of powdered metals, alloys, or mixtures of metal and alloys onto an article using a jet of high velocity gas to form continuous metallic coating at temperatures well below the fusing temperatures of the powdered material. Details of the cold-gas dynamic spray deposition technology are disclosed in U.S. Pat. No. 5,302,414 to Alkhimov et al. It has been determined that aluminum provides good results when applied to glass using the cold-gas dynamic spray deposition. The aluminum layer adheres extremely well to the glass and may create a chemical bond in the form of aluminum silicate. However, other materials may also be applied as a first layer using cold-spray, including tin, zinc, silver and gold. Since the cold-gas dynamic spray technology can be used at low temperatures (e.g., near room temperature), it is suitable for metalizing materials having a relatively low melting point, such as polycarbonates or other plastics, as well as for metalizing conventional materials such as glass, alumina, and ceramics.

For the initial metallic layer deposited on the sheet 304, it is believed that any of chromium, nickel, aluminum, tin, tin-bismuth alloy, gold, gold-tin alloy can be used, this list being given in order of increasing adhesion to glass. Any of these materials can be applied to the sheet seal-ring area 318 using any of the CVD or PVD technologies (e.g., sputtering) previously described. After the initial layer 602 is deposited onto the sheet seal-ring area 318 of the nonmetallic sheet 304, additional metal layers, e.g., second layer 604, third layer 606 and fourth layer 608 (as applicable) can be added by any of the deposition methods previously described, including solution bath plating. It is believed that the application of the following rules will result in satisfactory thicknesses for the various metal layers. Rule No. 1: the minimum thickness, except for the aluminum or tin-based metals or alloys which will be bonded to the gold-plated Kovar alloy frame: 0.002 microns. Rule 2: the minimum thickness for aluminum or tin-based metals or alloys deposited onto the sheet or as the final layer, which will be bonded to the gold-plated Kovar alloy frame: 0.8 microns. Rule 3: the maximum thickness for aluminum or tin-based metals or alloys deposited onto the sheet or as the final layer, which will be bonded to the gold-plated Kovar alloy frame: 63.5 microns. Rule 4: the maximum thickness for metals, other than chromium, deposited onto the sheet as the first layer and which will have other metals or alloys deposited on top of them: 25 microns. Rule 5: the maximum thickness for metals, other than chromium, deposited onto other metals or alloys as intermediate layers: 6.35 microns. Rule 6: the minimum thickness for metals or alloys deposited onto the sheet or as the final layer, which will act as the solder for attachment to the gold-plated Kovar alloy frame: 7.62 microns. Rule 7: the maximum thickness for metals or alloys deposited onto the sheet or as the final layer, which will act as the solder for attachment to the gold-plated Kovar alloy frame: 101.6 microns. Rule 8: the maximum thickness for chromium: 0.25 microns. Rule 9: the minimum thickness for gold-tin solder, applied via inkjet or supplied as a solder preform: 6 microns. Rule 10: the maximum thickness for gold-tin solder, applied via inkjet or supplied as a solder preform: 101.6 microns. Rule 11: The minimum thickness for immersion zinc; 0.889 microns. Note that the above rules apply to metals deposited using all deposition methods other than cold-gas dynamic spray deposition.

For cold spray applications, the following rules apply: Rule 1: the minimum practical thickness for any metal layer: 2.54 microns. Rule 2: the maximum practical thickness for the first layer, and all additional layers, but not including the final Kovar alloy layer: 127 microns. Rule 3: the maximum practical thickness for the final Kovar alloy layer: 12,700 microns, i.e., 0.5 inches.

By way of example, not to be considered limiting, the following metal combinations are believed suitable for seal-ring area 318 when bonding the prepared sheet 304 to a Kovar alloy-nickel-gold frame 302 (i.e., Kovar alloy core plated first with nickel and then with gold) using thermal compression (TC) bonding, or sonic, ultrasonic or thermosonic bonding.

EXAMPLE 1

| Layers | Metal | Deposition | Min. (microns) | Max. (microns) |
|---|---|---|---|---|
| 1 | Al | CVD, PVD | 0.7 | 63.5 |

EXAMPLE 2

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or SnBi | CVD, PVD, SBP | 0.7 | 63.5 |

EXAMPLE 3

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

EXAMPLE 4

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Sn or Sn—Bi | CVD, PVD, SBP | 0.7 | 63.5 |

EXAMPLE 5

| Layers | Metal | Deposition | Min. (microns) | Max. (microns) |
|---|---|---|---|---|
| 1 | Sn (de-stressed) | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

EXAMPLE 6

| Layers | Metal | Deposition | Min. (microns) | Max. (microns) |
|---|---|---|---|---|
| 1 | Sn—Bi | CVD, PVD | 0.7 | 63.5 |

EXAMPLE 7

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn or Sn—Bi | CVD, PVD, SBP | 0.7 | 63.5 |

EXAMPLE 8

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Al | CVD, PVD, SBP | 0.7 | 63.5 |

EXAMPLE 9

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Zn | CVD, PVD, SBP | 0.002 | 6.35 |
| 4 | Al | CVD, PVD, SBP | 0.7 | 63.5 |

EXAMPLE 10

| Layers | Metal | Deposition | Min. (microns) | Max. (microns) |
|---|---|---|---|---|
| 1 | Ni | CVD, PVD | 0.002 | 152.4 |
| 2 | Sn or Sn—Bi | CVD, PVD, SBP | 0.7 | 63.5 |

EXAMPLE 11

| Layers | Metal | Deposition | Min. (microns) | Max. (microns) |
|---|---|---|---|---|
| 1 | Ni | CVD, PVD | 0.002 | 152.4 |
| 2 | Al | CVD, PVD, SBP | 0.7 | 63.5 |

EXAMPLE 12

| Layers | Metal | Deposition | Min. (microns) | Max. (microns) |
|---|---|---|---|---|
| 1 | Ni | CVD, PVD | 0.002 | 152.4 |
| 2 | Zn | CVD, PVD, SBP | 0.002 | 6.35 |
| 3 | Al | CVD, PVD, SBP | 0.7 | 63.5 |

EXAMPLE 13

| Layers | Metal | Deposition | Min. (microns) | Max. (microns) |
|---|---|---|---|---|
| 1 | Sn | CVD, PVD | 0.7 | 63.5 |

EXAMPLE 14

| Layers | Metal | Deposition | Min. (microns) | Max. (microns) |
|---|---|---|---|---|
| 1 | Cr | CVD, PVD | 0.002 | 0.15 |

EXAMPLE 15

| Layers | Metal | Deposition | Min. (microns) | Max. (microns) |
|---|---|---|---|---|
| 1 | Ni | CVD, PVD | 0.002 | 152.4 |

EXAMPLE 16

| Layers | Metal | Deposition | Min. (microns) | Max. (microns) |
|---|---|---|---|---|
| 1 | Sn—Bi | CVD, PVD | 0.7 | 63.5 |

By way of further example, not to be considered limiting, the following metal combinations and thicknesses are preferred for seal-ring area 318 when bonding the prepared sheet 304 to a Kovar alloy-nickel-gold frame 302 using thermal compression (TC) bonding, or sonic, ultrasonic or thermosonic bonding.

EXAMPLE 17

| Layers | Metal | Deposition | Min. (microns) | Max. (microns) |
|---|---|---|---|---|
| 1 | Al | CVD, PVD | 1 | 50.8 |

EXAMPLE 18

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or SnBi | CVD, PVD, SBP | 1 | 50.8 |

EXAMPLE 19

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn or Sn—Bi | CVD, PVD, SBP | 1 | 50.8 |

EXAMPLE 20

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Sn or Sn—Bi | CVD, PVD, SBP | 1 | 50.8 |

EXAMPLE 21

| Layers | Metal | Deposition | Min. (microns) | Max. (microns) |
|---|---|---|---|---|
| 1 | Sn (de-stressed) | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or Sn—Bi | CVD, PVD, SBP | 1 | 50.8 |

EXAMPLE 22

| Layers | Metal | Deposition | Min. (microns) | Max. (microns) |
|---|---|---|---|---|
| 1 | Sn—Bi | CVD, PVD | 1 | 50.8 |

EXAMPLE 23

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn or Sn—Bi | CVD, PVD, SBP | 1 | 50.8 |

EXAMPLE 24

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Al | CVD, PVD, SBP | 1 | 50.8 |

EXAMPLE 25

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Zn | CVD, PVD, SBP | 0.3175 | 5.08 |
| 4 | Al | CVD, PVD, SBP | 1 | 50.8 |

EXAMPLE 26

| Layers | Metal | Deposition | Min. (microns) | Max. (microns) |
|---|---|---|---|---|
| 1 | Ni | CVD, PVD | 0.1 | 5.08 |
| 2 | Sn or Sn—Bi | CVD, PVD, SBP | 1 | 50.8 |

EXAMPLE 27

| Layers | Metal | Deposition | Min. (microns) | Max. (microns) |
|---|---|---|---|---|
| 1 | Ni | CVD, PVD | 0.1 | 5.08 |
| 2 | Al | CVD, PVD, SBP | 1 | 50.8 |

EXAMPLE 28

| Layers | Metal | Deposition | Min. (microns) | Max. (microns) |
|---|---|---|---|---|
| 1 | Ni | CVD, PVD | 0.1 | 5.08 |
| 2 | Zn | CVD, PVD, SBP | 0.3175 | 5.08 |
| 3 | Al | CVD, PVD, SBP | 1 | 50.8 |

EXAMPLE 29

| Layers | Metal | Deposition | Min. (microns) | Max. (microns) |
|---|---|---|---|---|
| 1 | Sn | CVD, PVD | 1 | 50.8 |

EXAMPLE 30

| Layers | Metal | Deposition | Min. (microns) | Max. (microns) |
|---|---|---|---|---|
| 1 | Cr | CVD, PVD | 0.05 | 0.12 |

EXAMPLE 31

| Layers | Metal | Deposition | Min. (microns) | Max. (microns) |
|---|---|---|---|---|
| 1 | Ni | CVD, PVD | 0.1 | 50.8 |

EXAMPLE 32

| Layers | Metal | Deposition | Min. (microns) | Max. (microns) |
|---|---|---|---|---|
| 1 | Sn—Bi | CVD, PVD | 1 | 50.8 |

As indicated above, the previous examples are believed suitable for application of, among other processes, thermal compression bonding. TC bonding, also referred to as "diffusion bonding" or "diffusion welding" in various disciplines, is a process of diffusion bonding in which two prepared surfaces are brought into intimate contact, and plastic deformation is induced by the combined effect of pressure and temperature, which in turn results in atom movement causing the development of a crystal lattice bridging the gap between facing surfaces and resulting in bonding. TC bonding takes place at significantly lower temperatures than many other forms of bonding such as braze soldering.

Referring now to FIG. 7, there is illustrated a cross-sectional view of the prefabricated frame 302 suitable for use in this embodiment. The illustrated frame 302 includes a Kovar alloy core 702 overlaid with a first metallic layer 704 of nickel which, in turn, is overlaid by an outer layer 706 of gold. The use of Kovar alloy for the core 702 of the frame 302 is preferred where hard glass, e.g., Corning 7056 or 7058, is used for the sheet 304 and where Kovar alloy or a similar material is used for the package base 104, since these materials have a CTE for the temperature range 30° C. to 300° C. that is within the range from about $5.0 \cdot 10^{-6}$/° K to about $5.6 \cdot 10^{-6}$/° K (e.g. from about 5.0 to about 5.6 ppm/° K).

Referring still to FIG. 7, another step of the manufacturing process is the preparation of a prefabricated frame 302 for joining to the sheet 304. As previously described, the frame 302 includes a continuous sidewall 306 which defines an aperture 308 therethrough. The sidewall 306 includes a frame seal-ring area 310 on its upper surface and a base seal-ring area 320 on its lower surface. The frame seal-ring area 310 is generally dimensioned to conform with the sheet seal-ring area 318 of the transparent sheet 304, while the base seal-ring area 320 is dimensioned to conform against the corresponding seal area on the package base. The frame 302 may be manufactured using various conventional metal forming technologies, including stamping, casting, die casting, extrusion/parting, and machining. It is contemplated that stamping or die casting will be the most cost effective method for producing the frames 302. Depending upon the degree of flatness required for the contemplated bonding procedure and the degree achieved by a particular frame manufacturing method, surface grinding, and possibly even lapping or polishing, may be required on the frame seal-ring area 310 or base seal-ring area 320, to provide the final flatness necessary for a successful hermetic seal.

In this example, the base seal-ring area 320 is on the frame face opposite frame seal-ring area 310, and utilizes the same layers of nickel 704 overlaid by gold 706 to facilitate eventual welding to the package base 104.

It is important for the frame 302 to serve as a "heat sink" and "heat spreader" when the cover assembly 300 is eventually welded to the package base 104. It is contemplated that conventional high temperature welding processes (e.g., automatic resistance seam welding or laser welding) will be used for this operation. If the metallized glass sheet 304 was welded directly to the package base 104 using these welding processes, the concentrated heat would cause thermal stresses likely to crack the glass sheet or distort its optical properties. However, when a metal frame is attached to the transparent sheet, it acts as both a heat sink, absorbing some of the heat of welding, and as a heat spreader, distributing the heat over a wider area such that the thermal stress on the transparent sheet 304 is reduced to minimize the likelihood of cracking or optical distortion. Kovar alloy is especially useful in this heat sink and heat spreading role as explained by Kovar alloy's thermal conductivity, 0.0395, which is approximately fourteen times higher than the thermal conductivity of Corning 7052 glass, 0.0028.

Another important aspect of the frame 302 is that it must be formed from a material having a CTE that is similar to the CTE of the transparent sheet 304 and the CTE of the package base 104. This matching of CTE between the frame 302, transparent sheet 304 and package base 104 is required to minimize stresses between these components after they are joined to one another so as to ensure the long term reliability of the hermetic seal therebetween under conditions of thermal cycling and/or thermal shock environments.

For window assemblies that will be attached to package bases formed of ceramic, alumina or Kovar alloy, Kovar alloy is preferred for use as the material for the frame 304. Although Kovar alloy will be used for the frames in many of the embodiments discussed in detail herein, it will be understood that Kovar alloy is not necessarily suitable for use with all transparent sheet materials. Additionally, other frame materials besides Kovar alloy may be suitable for use with glass. Suitability is determined by the necessity that the material of the transparent sheet 304, the material of the frame 302 and the material of the package base 104 all have closely matching CTEs to insure maximum long-term reliability of the hermetic seals.

Referring now to FIG. 8, the next step of the manufacturing process is to position the frame 302 against the sheet 304 such that at least a portion of the frame seal-ring area 310 and a least a portion of the sheet seal-ring area 318 contact one another along a continuous junction region 804 that circumscribes the window portion 312. Actually, in some cases a plasma-cleaning operation is performed on the seal-ring areas and any other sealing surfaces just prior to joining the components to ensure maximum reliability of the joint. In FIG. 8, the sheet 304 moves from its original position (denoted in broken lines) until it is in contact with the frame 302. It is, of course, first necessary to remove any remaining tacky tape or other masking materials left over from operations used to prepare the sheet seal-ring area 318 if they cannot withstand the elevated temperatures encountered in the joining process without degradation of the mask material and/or its adhesive, if an adhesive is used to attach the mask to the sheet. It will be appreciated that it is not necessary that the sheet seal-ring area 318 and the frame seal-ring area 310 have an exact correspondence with regard to their entire areas, rather, it is only necessary that there be some correspondence between the two seal-ring areas forming a continuous junction region 804 which circumscribes the window portion 312. In the embodiment illustrated in FIG. 8, the metallized layers 610 in the sheet seal-ring area 318 are much wider than the plated outer layer 706 of the frame seal-ring area 310. Further, the window portion 312 of the sheet 304 extends partway through the frame aperture 308, providing a means to center the sheet 304 on the frame 302.

The next step of the manufacturing process is to heat the junction region 804 until a metal-to-metal joint is formed between the frame 302 and the sheet 304 all along the junction region, whereby a hermetic seal circumscribing the window portion 312 is formed. It is necessary that during the step of heating the junction region 804, the temperature of the window portion 312 of the sheet 304 remain below its glass transition temperature, $T_G$ to prevent damage to the finished surfaces 314 and 316. The current invention contemplates several options for accomplishing this heating. A first option is to utilize thermal compression (TC) bonding, also known as diffusion bonding or diffusion welding. As previously described, TC bonding involves the application of high pressures to the materials being joined such that a reduced temperature is required to produce the necessary diffusion bond. Rules for determining the thickness and composition of the metallic layers 610 on the sheet 304 were previously provided, for TC bonding to, e.g., a Kovar alloy, nickel or gold frame such as illustrated in FIG. 7. The estimated process parameters for the TC bonding of a Kovar alloy/nickel/gold frame 302 to a metallized sheet 304 having aluminum as the final layer would be a temperature of approximately 380° C. at an applied pressure of approximately 95,500 psi. Under these conditions, the gold plating 706 on the Kovar alloy frame 302 will diffuse into/with the aluminum layer, e.g., layer 4 in Example 7. Since the 380° C. temperature necessary for TC bonding is below the approximately 500° C. to 900° C. $T_G$ for hard glasses such as Corning 7056, the TC bonding process could be performed in a single or batch mode by fixturing the cover assembly components 302, 304 together in compression and placing the compressed assemblies into a furnace (or oven, etc.) at approximately 380° C. The hermetic bond would be obtained without risking the finished surfaces 314 and 316 of the window portion 312.

Alternatively, employing resistance welding at the junction area 804 to add additional heat in addition to the TC bonding could allow preheating the window assemblies to less than 380° C. and possibly reduce the overall bonding process time. In another method, the TC bonding could be accomplished by fixturing the cover assembly components 302 and 304 using heated tooling that would heat the junction area 304 by conduction. In yet another alternative method, resistance welding can be used to supply 100% of the heat required to achieve the necessary TC bonding temperature, thereby eliminating the need for furnaces, ovens, etc. or specialized thermally conductive tooling.

After completion of TC bonding or other welding processes, the window assembly 300 is ready for final processing, for example, chamfering the edges of the cover assembly to smooth them and prevent chipping, scratching, marking, etc., during post-assembly, cleaning, marking or other operations.

Referring now to FIG. 9, there is illustrated a block diagram of the manufacturing process just described in accordance with one embodiment of the current invention. Block 902 represents the step of obtaining a sheet of transparent material, e.g., glass or other material, having finished top and bottom surfaces as previously described. The process then proceeds to block 904 as indicated by the arrow.

Block 904 represents the step of applying surface treatments to the sheet, e.g., scratch-resistant or anti-reflective coatings, as previously described. In addition to these permanent surface treatments, block 904 also represents the sub-steps of applying tape or other temporary masks to the surfaces of the sheet to protect them during the subsequent steps of the process. It will be appreciated that the steps represented by block 904 are optional and that one or more of these steps may not be present in every embodiment of the invention. The process then proceeds to block 906 as indicated by the arrow.

Block 906 represents the step of preparing the seal-ring area on the sheet to provide better adhesion for the required metallic layers. This step usually involves roughening the seal-ring area using chemical etching, mechanical grinding, laser ablating or sandblasting as previously described. To the extent necessary, block 906 also represents the sub-steps of removing any masking material from the seal-ring area. It will be appreciated that the steps represented by block 906 are optional and that some or all of these steps may not be present in every embodiment of the invention. The process then proceeds to block 908 as indicated by the arrow.

Block 908 represents the step of metallizing the seal-ring areas of the sheet. The step represented by block 908 is mandatory since at least one metallic layer must be applied to the seal-ring area of the sheet. In most embodiments, block 908 will represent numerous sub-steps for applying successive metallic layers to the sheet, where the layers of each sub-step may be applied by processes including CVD, PVD, cold-spray or solution bath plating as previously described. Following the steps represented by block 908, the sheet is ready for joining to the frame. However, before the process can proceed to this joining step (i.e., block 916), a suitable frame must first be prepared.

Block 910 represents the step of obtaining a pre-fabricated frame having a CTE that closely matches the CTE of the transparent sheet from block 902 and the CTE of the package base. In most cases where the base is alumina or Kovar alloy, a frame formed of Kovar alloy will be suitable. As previously described, the frame may be formed using, e.g., stamping, die-casting or other known metal-forming processes. The process then proceeds to block 912 as indicated by the arrow.

Block 912 represents the step of grinding, polishing and/or otherwise flattening the seal-ring areas of the frame as necessary to increase its flatness so that it will fit closely against the seal-ring areas of the transparent sheet. It will be appreciated that the steps represented by block 912 are optional and may not be necessary or present in every embodiment of the invention. The process then proceeds to block 914 as indicated by the arrow.

Block 914 represents the step of applying additional metallic layers to the seal-ring areas of the frame. These metallic layers are frequently necessary to achieve compatible chemistry for bonding with the metallized seal-ring areas of the transparent sheet. In most embodiments, block 914 will represent numerous sub-steps for applying successive metallic layers to the frame. Once the steps represented by block 914 are completed, the frame is ready for joining to the transparent sheet. Thus, the results of process block 908 and block 914 both proceed to block 916 as indicated by the arrows.

Block 916 represents the step of clamping the prepared frame together with the prepared transparent sheet so that their respective metallized seal-ring areas are in contact with one another under conditions producing a predetermined contact pressure at the junction region circumscribing the window portion. This predetermined contact pressure between the seal-ring surfaces allows thermal compression (TC) bonding of the metallized surfaces to occur at a lower temperature than would be required for conventional welding (including most soldering and brazing processes). The process then proceeds to block 918 as indicated by the arrow.

Block 918 represents the step of applying heat to the junction between the frame and the transparent sheet while maintaining the predetermined contact pressure until the temperature is sufficient to cause thermal compression bonding to occur. In some embodiments, block 918 will represent a single heating step, e.g., heating the fixtured assembly in a furnace. In other embodiments, block 918 will represent several sub-steps for applying heat to the junction area, for example, first preheating the fixtured assembly (e.g., in a furnace) to an intermediate temperature, and then using resistance welding techniques along the junction to raise the temperature of the localized area of the metallic layers the rest of the way to the temperature where thermal compression bonding will occur. The thermal compression bonding creates a hermetic seal between the transparent sheet material and the frame. The process then proceeds to block 920 as indicated by the arrow.

Block 920 represents the step of completing the window assembly. Block 920 may represent merely cooling the window assembly after thermal compression bonding, or it may represent additional finishing processes including chamfering the edges of the assembly to prevent chipping, cracking, etc., marking the assembly, or other post-assembly procedures. The process of this embodiment has thus been described.

It will be appreciated that in alternative embodiments of the invention, conventional welding techniques (including soldering and/or brazing) may be used instead of thermal compression bonding to join the frame to the transparent sheet. In such alternative embodiments, the steps represented by blocks 916 and 918 of FIG. 9 would be replaced by the steps of fixturing the frame and transparent sheet together so that the metallized seal-ring areas are in contact with one another (but not necessarily producing a predetermined contact pressure along the junction) and then applying heat to the junction area using conventional means until the temperature is sufficient to cause the melting and diffusing of the metallic layers necessary to achieve the welded bond.

In an alternative embodiment, braze-soldering is used to join the frame 302 to the metallized sheet 304. In this embodiment, a solder metal or solder alloy is utilized as the final layer of the metallic layers 610 on the metallized sheet 304, and clamping the sheet 304 to the frame 302 at a high predetermined contact pressure is not required. Light to moderate clamping pressure can be used: 1) to insure alignment during the solder's molten phase; and 2) to promote even distribution of the molten solder all along the junction region between the respective seal-ring areas; thereby helping to insure a hermetic seal, however, this clamping pressure does not contribute to the bonding process itself as in TC bonding. In most other respects, however, this embodiment is substantially similar to that previously described.

The following examples, not to be considered limiting, are provided to illustrate the details of the metallic layers 610 in the sheet seal-ring area 318 that are suitable for braze-soldering to a Kovar alloy/nickel/gold frame 302 such as that illustrated in FIG. 7.

EXAMPLE 33

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 34

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 35

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 36

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 37

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 38

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Eutectic Au—Sn solder | CVD, PVD, SBP | 1.27 | 127 |

EXAMPLE 39

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 40

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi solder | CVD, PVD, SBP | 1.27 | 152.4 |

EXAMPLE 41

| Layers | Metal | Deposition | Min. (microns) | Max. (microns) |
|---|---|---|---|---|
| 1 | Cr | CVD, PVD | 0.002 | 0.15 |
| 2 | Sn—Bi solder | CVD, PVD, SBP | 1.27 | 152.4 |

EXAMPLE 42

| Layers | Metal | Deposition | Min. (microns) | Max. (microns) |
|---|---|---|---|---|
| 1 | De-stressed Sn Solder | CVD, PVD | 1.27 | 152.4 |

EXAMPLE 43

| Layers | Metal | Deposition | Min. (microns) | Max. (microns) |
|---|---|---|---|---|
| 1 | Sn—Bi Solder | CVD, PVD | 1.27 | 152.4 |

EXAMPLE 44

| Layers | Metal | Deposition | Min. (microns) | Max. (microns) |
|---|---|---|---|---|
| 1 | Eutectic Au—Sn Solder | CVD, PVD | 1.27 | 127 |

EXAMPLE 45

| Layers | Metal | Deposition | Min. (microns) | Max. (microns) |
|---|---|---|---|---|
| 1 | Ni | CVD, PVD | 0.002 | 152.4 |
| 2 | Eutectic Au—Sn Solder | CVD, PVD, SBP | 1.27 | 127 |

EXAMPLE 46

| Layers | Metal | Deposition | Min. (microns) | Max. (microns) |
|---|---|---|---|---|
| 1 | Ni | CVD, PVD | 0.002 | 152.4 |
| 2 | Sn—Bi Solder | CVD, PVD, SBP | 1.27 | 152.4 |

By way of further examples, not to be considered limiting, the following combinations are preferred for the metallic layers 610 in the sheet seal-ring area 318 for braze-soldering to a Kovar alloy/nickel/gold frame 302 such as that illustrated in FIG. 7.

EXAMPLE 47

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Eutectic Au—Sn solder | CVD, PVD, SBP | 2.54 | 63.5 |

EXAMPLE 48

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi solder | CVD, PVD, SBP | 2.54 | 127 |

EXAMPLE 49

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

EXAMPLE 50

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

EXAMPLE 51

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

EXAMPLE 52

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Eutectic Au—Sn solder | CVD, PVD, SBP | 2.54 | 63.5 |

EXAMPLE 53

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

EXAMPLE 54

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi solder | CVD, PVD, SBP | 2.54 | 127 |

EXAMPLE 55

| Layers | Metal | Deposition | Min. (microns) | Max. (microns) |
|---|---|---|---|---|
| 1 | Cr | CVD, PVD | 0.05 | 0.12 |
| 2 | Sn—Bi solder | CVD, PVD, SBP | 2.54 | 127 |

EXAMPLE 56

| Layers | Metal | Deposition | Min. (microns) | Max. (microns) |
|---|---|---|---|---|
| 1 | De-stressed Sn Solder | CVD, PVD | 2.54 | 127 |

EXAMPLE 57

| Layers | Metal | Deposition | Min. (microns) | Max. (microns) |
|---|---|---|---|---|
| 1 | Sn—Bi Solder | CVD, PVD | 2.54 | 127 |

EXAMPLE 58

| Layers | Metal | Deposition | Min. (microns) | Max. (microns) |
|---|---|---|---|---|
| 1 | Eutectic Au—Sn Solder | CVD, PVD | 2.54 | 63.5 |

EXAMPLE 59

| Layers | Metal | Deposition | Min. (microns) | Max. (microns) |
|---|---|---|---|---|
| 1 | Ni | CVD, PVD | 0.1 | 5.08 |
| 2 | Eutectic Au—Sn Solder | CVD, PVD, SBP | 2.54 | 63.5 |

EXAMPLE 60

| Layers | Metal | Deposition | Min. (microns) | Max. (microns) |
|---|---|---|---|---|
| 1 | Ni | CVD, PVD | 0.1 | 5.08 |
| 2 | Sn—Bi Solder | CVD, PVD, SBP | 2.54 | 127 |

Referring now to FIG. 10, there is illustrated yet another embodiment of the current invention. Note that in this embodiment, the cover assembly 300 is circular in configuration rather than rectangular. It will be appreciated that this is simply another possible configuration for a cover assembly manufactured in accordance with this invention, and that this embodiment is not limited to configurations of any particular shape. As in the embodiment previously described, this embodiment also uses braze-soldering to hermetically join the transparent sheet 304 to the frame 302. However, in this embodiment, the solder is provided in the form of a separate solder preform 1000 having the shape of the sheet seal-ring area 318 or the frame seal-ring area 310.

In this embodiment, instead of positioning the frame and the sheet directly against one another, the frame 302 and the sheet 304 are instead positioned against opposite sides of the solder preform 1000 such that the solder preform is interposed between the frame seal-ring area 310 and the sheet seal-ring are 318 along a continuous junction region that circumscribes the window portion 312. After the frame 302 and sheet 304 are positioned against the solder preform 1000, the junction region is heated until the solder preform fuses forming a solder joint between the frame and sheet all along the junction region. The heating of the junction region may be performed by any of the procedures previously described, including heating or preheating in a furnace, oven, etc., either alone or in combination with other heating methods including resistance welding. It is required that during the step of heating the junction region, the temperature of the window portion 312 of the sheet 304 remain below the glass transition temperature $T_G$ such that the finished surfaces 314 and 316 on the sheet are not adversely affected.

The current embodiment using a solder preform 1000 can be used for joining a metallized sheet 304 to a Kovar alloy/nickel/gold frame such as that illustrated in FIG. 7. In accordance with a preferred embodiment, the solder preform 1000 is formed of a gold-tin (Au—Sn) alloy, and in a more preferred embodiment, the gold-tin alloy is the eutectic composition. The thickness of the gold-tin perform 1000 will be within the range from about 6 microns to about 101.2 microns.

The following examples, not to be considered limiting, are provided to illustrate the details of the metallic layers 610 and the sheet seal-ring area 318 that are suitable for braze-soldering to a Kovar alloy/nickel/gold frame in combination with a gold-tin solder preform.

EXAMPLE 61

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 62

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 63

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 64

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 65

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 66

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Au | CVD, PVD, SBP | 0.0508 | 0.508 |

EXAMPLE 67

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 68

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi | CVD, PVD, SBP | 0.635 | 12.7 |

EXAMPLE 69

| Layers | Metal | Deposition | Min. (microns) | Max. (microns) |
|---|---|---|---|---|
| 1 | Cr | CVD, PVD | 0.002 | 0.15 |
| 2 | Sn—Bi | CVD, PVD, SBP | 0.635 | 12.7 |

EXAMPLE 70

| Layers | Metal | Deposition | Min. (microns) | Max. (microns) |
|---|---|---|---|---|
| 1 | Cr | CVD, PVD | 0.002 | 0.15 |

EXAMPLE 71

| Layers | Metal | Deposition | Min. (microns) | Max. (microns) |
|---|---|---|---|---|
| 1 | Destressed Sn or Sn—Bi | CVD, PVD | 0.635 | 12.7 |

EXAMPLE 72

| Layers | Metal | Deposition | Min. (microns) | Max. (microns) |
|---|---|---|---|---|
| 1 | Au | CVD, PVD | 0.0508 | 0.508 |

EXAMPLE 73

| Layers | Metal | Deposition | Min. (microns) | Max. (microns) |
|---|---|---|---|---|
| 1 | Ni | CVD, PVD | 0.002 | 152.4 |
| 2 | Au | CVD, PVD, SBP | 0.0508 | 0.508 |

EXAMPLE 74

| Layers | Metal | Deposition | Min. (microns) | Max. (microns) |
|---|---|---|---|---|
| 1 | Ni | CVD, PVD | 0.002 | 152.4 |
| 2 | Sn—Bi | CVD, PVD, SBP | 0.635 | 12.7 |

EXAMPLE 75

| Layers | Metal | Deposition | Min. (microns) | Max. (microns) |
|---|---|---|---|---|
| 1 | Ni | CVD, PVD | 0.002 | 152.4 |
| 2 | Sn (destressed after deposition) | CVD, PVD, SBP | 0.635 | 12.7 |

By way of further examples, not to be considered limiting, the following combinations are preferred for the metallic layers 610 and the sheet seal-ring area 318 for braze-soldering to a Kovar alloy/nickel/gold frame in combination with a gold-tin soldered preform.

EXAMPLE 76

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Au | CVD, PVD, SBP | 0.127 | 0.381 |

EXAMPLE 77

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi | CVD, PVD, SBP | 2.54 | 7.62 |

EXAMPLE 78

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

EXAMPLE 79

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

EXAMPLE 80

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

EXAMPLE 81

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Au | CVD, PVD, SBP | 0.127 | 0.381 |

EXAMPLE 82

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

EXAMPLE 83

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi | CVD, PVD, SBP | 2.54 | 7.62 |

EXAMPLE 84

| Layers | Metal | Deposition | Min. (microns) | Max. (microns) |
|---|---|---|---|---|
| 1 | Cr | CVD, PVD | 0.05 | 0.12 |
| 2 | Sn—Bi | CVD, PVD, SBP | 2.54 | 7.62 |

EXAMPLE 85

| Layers | Metal | Deposition | Min. (microns) | Max. (microns) |
|---|---|---|---|---|
| 1 | Cr | CVD, PVD | 0.05 | 0.12 |

EXAMPLE 86

| Layers | Metal | Deposition | Min. (microns) | Max. (microns) |
|---|---|---|---|---|
| 1 | Destressed Sn or Sn—Bi | CVD, PVD | 2.54 | 7.62 |

EXAMPLE 87

| Layers | Metal | Deposition | Min. (microns) | Max. (microns) |
|---|---|---|---|---|
| 1 | Au | CVD, PVD | 0.127 | 0.381 |

EXAMPLE 88

| Layers | Metal | Deposition | Min. (microns) | Max. (microns) |
|---|---|---|---|---|
| 1 | Ni | CVD, PVD | 0.1 | 5.08 |
| 2 | Au | CVD, PVD, SBP | 0.127 | 0.381 |

EXAMPLE 89

| Layers | Metal | Deposition | Min. (microns) | Max. (microns) |
|---|---|---|---|---|
| 1 | Ni | CVD, PVD | 0.1 | 5.08 |
| 2 | Sn—Bi | CVD, PVD, SBP | 2.54 | 7.62 |

EXAMPLE 90

| Layers | Metal | Deposition | Min. (microns) | Max. (microns) |
|---|---|---|---|---|
| 1 | Ni | CVD, PVD | 0.1 | 5.08 |
| 2 | Sn (destressed after deposition) | CVD, PVD, SBP | 2.54 | 7.62 |

Referring now to FIG. 11, there is illustrated yet another embodiment of the current invention. This embodiment also uses soldering, however, in this embodiment the solder is applied via inkjet technology to either the metallized area 610 in the sheet seal-ring area 318 or the sheet seal-ring 310 of the frame assembly. FIG. 11 shows a portion of the Kovar alloy/nickel/gold frame 302 and an inkjet dispensing head 1102 which is dispensing overlapping drops of solder 1104 onto the frame seal-ring area 310 as the dispensing head moves around the frame aperture 308 as indicated by arrow 1106. Preferably, the inkjet dispensed solder is a gold-tin (Au—Sn) alloy, and more preferably it is the eutectic composition. The thickness of the gold-tin solder applied by dispensing head 1102 in this embodiment is within the range from about 6 microns to about 101.2 microns. It will be appreciated that while the example illustrated in FIG. 11 shows the dispensing head 1102 depositing the solder droplets 1104 onto the frame 302, in other embodiments the inkjet deposited solder may be applied to the sheet seal-ring area 318, either alone or in combination with applications on the frame seal-ring area 310. In still other embodiments, the inkjet deposited solder may be used to create a discrete solder preform that would be employed as described in the previous examples herein. Details of the metallic layers 610 in the sheet seal-ring area 318 that are suitable for a soldering to a Kovar alloy/nickel/gold frame 302 such as that illustrated in FIG. 7 using inkjet supplied solder are substantially identical to those layers illustrated in previous Examples 21 through 32.

Referring now to FIGS. 12a through 12c and FIGS. 13a through 13c, there is illustrated yet another alternative method for manufacturing cover assemblies constituting another embodiment of the current invention. Whereas, in the previous embodiments a separate prefabricated metal frame was joined to the transparent sheet to act as a heat spreader/heat sink needed for subsequent welding, in this embodiment a cold gas dynamic spray deposition process is used to fabricate a metallic frame/heat spreader directly on the transparent sheet material. In other words, in this embodiment the frame is fabricated directly on the transparent sheet as an integral part, no subsequent joining operation is required. In addition, since cold gas dynamic spray deposition can be accomplished at near room temperature, this method is especially useful where the transparent sheet material and/or surface treatments thereto have a relatively low $T_G$, melting temperature, or other heat tolerance parameter.

Referring specifically to FIG. 12a, there is illustrated a sheet of transparent material 304 having a window portion 312 defined thereupon. The window portion 312 has finished top and bottom surfaces 314 and 316 (note that the 304 sheet appears bottom side up in FIGS. 12a through 12c). A frame attachment area 1200 is defined on the sheet 204, the frame attachment area circumscribing the window portion 312. It will be appreciated in the embodiment illustrated in FIG. 12 that the frame attachment area 1200 need not follow the specific boundaries of the window area 312 (i.e., which in this case are circular) as long as the frame attachment area 1200 completely circumscribes the window portion.

It will be appreciated that, unless specifically noted otherwise, the initial steps of obtaining a transparent sheet having a window portion with finished top and bottom surfaces, preparing the seal-ring area of the sheet and metallizing the seal-ring area of the sheet are substantially identical to those described for the previous embodiments and will not be described in detail again.

Referring now also to FIG. 13a, there is illustrated a partial cross-sectional view to the edge of the sheet 304. In this example, the step of preparing a frame attachment area 1200 on the sheet 304 comprises roughening the frame attachment area by roughening and/or grinding the surface from its original level (shown in broken line) to produce a recessed area 1302. After the frame attachment area 1200 has been prepared, metal layers are deposited into the frame attachment area of the sheet using cold gas dynamic spray deposition. In FIG. 12b, an initial metal layer 1202 has been applied into the frame attachment area 1200 using cold gas dynamic spray deposition.

Referring now also to FIG. 13b, the cold gas dynamic spray nozzle 1304 is shown depositing a stream of metal particles 1306 onto the frame attachment area 1200. The initial layer 1202 has now been overlaid with a secondary layer 1204 and the spray nozzle 1304 is shown as it begins to deposit the final Kovar alloy layer 1206.

Referring now to FIG. 12c, the completed cover assembly 1210 is illustrated including the integral frame/heat spreader 1212, which has been built up from layer 1206 to a predetermined height, denoted by reference numeral 1308, above the finished surface of the sheet. In a preferred embodiment, the predetermined height 1308 of the built-up metal frame above the frame attachment area 1200 is within the range from about 5% to about 100% of the thickness denoted by reference numeral 1310 of the sheet 304 beneath the frame attachment area. In the embodiment shown, the step of depositing metal using cold gas dynamic spray included depositing a layer of Kovar alloy onto the sheet to fabricate the built-up frame/heat spreader 1212. The use of cold gas dynamic spray deposition allows a tremendous range of thickness for this Kovar alloy layer, which thickness may be within the range from about 2.54 microns to about 12,700 microns. It will, of course, be appreciated that the frame/heat spreader 1212 may be fabricated through the deposition of materials other than Kovar alloy, depending upon the characteristics of the transparent sheet 304 and of the package base 104, especially their respective CTEs.

The following examples, not to be considered limiting, are provided to illustrate the details of the metallic layers, denoted collectively by reference numeral 1207 for forming a frame/heat spreader compatible with hard glass transparent sheets and Kovar alloy or ceramic package bases.

EXAMPLE 91

| Layers | Metal | Deposition | Min. (microns) | Max. (microns) |
|---|---|---|---|---|
| 1 | Al | cold gas spray | 2.54 | 127 |
| 2 | Cu | cold gas spray | 2.54 | 127 |
| 3 | Ni | cold gas spray | 2.54 | 127 |
| 4 | Kovar Alloy | cold gas spray | 127 | 12,700 |

EXAMPLE 92

| Layers | Metal | Deposition | Min. (microns) | Max. (microns) |
|---|---|---|---|---|
| 1 | Al | cold gas spray | 2.54 | 127 |
| 2 | Ni | cold gas spray | 2.54 | 127 |
| 3 | Kovar Alloy | cold gas spray | 127 | 12,700 |

EXAMPLE 93

| Layers | Metal | Deposition | Min. (microns) | Max. (microns) |
|---|---|---|---|---|
| 1 | Al | cold gas spray | 2.54 | 127 |
| 2 | Kovar Alloy | cold gas spray | 127 | 12,700 |

EXAMPLE 94

| Layers | Metal | Deposition | Min. (microns) | Max. (microns) |
|---|---|---|---|---|
| 1 | Kovar Alloy | cold gas spray | 127 | 12,700 |

EXAMPLE 95

| Layers | Metal | Deposition | Min. (microns) | Max. (microns) |
|---|---|---|---|---|
| 1 | Zn | cold gas spray | 2.54 | 127 |
| 2 | Ni | cold gas spray | 2.54 | 127 |
| 3 | Kovar alloy | cold gas spray | 127 | 12,700 |

EXAMPLE 96

| Layers | Metal | Deposition | Min. (microns) | Max. (microns) |
|---|---|---|---|---|
| 1 | Zn | cold gas spray | 2.54 | 127 |
| 2 | Kovar alloy | cold gas spray | 127 | 12,700 |

EXAMPLE 97

| Layers | Metal | Deposition | Min. (microns) | Max. (microns) |
|---|---|---|---|---|
| 1 | Cr | cold gas spray | 2.54 | 127 |
| 2 | Ni | cold gas spray | 2.54 | 127 |
| 3 | Kovar alloy | cold gas spray | 127 | 12,700 |

EXAMPLE 98

| Layers | Metal | Deposition | Min. (microns) | Max. (microns) |
|---|---|---|---|---|
| 1 | Cr | cold gas spray | 2.54 | 127 |
| 2 | Kovar alloy | cold gas spray | 127 | 12,700 |

EXAMPLE 99

| Layers | Metal | Deposition | Min. (microns) | Max. (microns) |
|---|---|---|---|---|
| 1 | Al | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

EXAMPLE 100

| Layers | Metal | Deposition | Min. (microns) | Max. (microns) |
|---|---|---|---|---|
| 1 | Ni | cold gas spray | 2.54 | 127 |
| 2 | Kovar Alloy | cold gas spray | 127 | 12,700 |

EXAMPLE 101

| Layers | Metal | Deposition | Min. (microns) | Max. (microns) |
|---|---|---|---|---|
| 1 | Sn or Sn—Bi | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

EXAMPLE 102

| Layers | Metal | Deposition | Min. (microns) | Max. (microns) |
|---|---|---|---|---|
| 1 | Sn or Sn—Bi | cold gas spray | 2.54 | 127 |
| 2 | Ni | cold gas spray | 2.54 | 127 |
| 3 | Kovar Alloy | cold gas spray | 127 | 12,700 |

By way of further examples, not to be considered limiting, the following combinations are preferred for the metallic layers 1207 for forming a frame/heat spreader compatible with hard glass transparent sheets and Kovar alloy or ceramic package bases.

EXAMPLE 103

| Layers | Metal | Deposition | Min. (microns) | Max. (microns) |
|---|---|---|---|---|
| 1 | Al | cold gas spray | 12.7 | 76.2 |
| 2 | Cu | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 104

| Layers | Metal | Deposition | Min. (microns) | Max. (microns) |
|---|---|---|---|---|
| 1 | Al | cold gas spray | 12.7 | 76.2 |
| 2 | Ni | cold gas spray | 12.7 | 76.2 |
| 3 | Kovar Alloy | cold gas spray | 635 | 2,540 |

EXAMPLE 105

| Layers | Metal | Deposition | Min. (microns) | Max. (microns) |
|---|---|---|---|---|
| 1 | Al | cold gas spray | 12.7 | 76.2 |
| 2 | Kovar Alloy | cold gas spray | 635 | 2,540 |

EXAMPLE 106

| Layers | Metal | Deposition | Min. (microns) | Max. (microns) |
|---|---|---|---|---|
| 1 | Kovar Alloy | cold gas spray | 635 | 2,540 |

EXAMPLE 107

| Layers | Metal | Deposition | Min. (microns) | Max. (microns) |
|---|---|---|---|---|
| 1 | Zn | cold gas spray | 12.7 | 76.2 |
| 2 | Ni | cold gas spray | 12.7 | 76.2 |
| 3 | Kovar alloy | cold gas spray | 635 | 2,540 |

EXAMPLE 108

| Layers | Metal | Deposition | Min. (microns) | Max. (microns) |
|---|---|---|---|---|
| 1 | Zn | cold gas spray | 12.7 | 76.2 |
| 2 | Kovar alloy | cold gas spray | 635 | 2,540 |

EXAMPLE 109

| Layers | Metal | Deposition | Min. (microns) | Max. (microns) |
|---|---|---|---|---|
| 1 | Cr | cold gas spray | 12.7 | 76.2 |
| 2 | Ni | cold gas spray | 12.7 | 76.2 |
| 3 | Kovar alloy | cold gas spray | 635 | 2,540 |

EXAMPLE 110

| Layers | Metal | Deposition | Min. (microns) | Max. (microns) |
|---|---|---|---|---|
| 1 | Cr | cold gas spray | 12.7 | 76.2 |
| 2 | Kovar alloy | cold gas spray | 635 | 2,540 |

EXAMPLE 111

| Layers | Metal | Deposition | Min. (microns) | Max. (microns) |
|---|---|---|---|---|
| 1 | Al | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 112

| Layers | Metal | Deposition | Min. (microns) | Max. (microns) |
|---|---|---|---|---|
| 1 | Ni | cold gas spray | 12.7 | 76.2 |
| 2 | Kovar Alloy | cold gas spray | 635 | 2,540 |

EXAMPLE 113

| Layers | Metal | Deposition | Min. (microns) | Max. (microns) |
|---|---|---|---|---|
| 1 | Sn or Sn—Bi | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 114

| Layers | Metal | Deposition | Min. (microns) | Max. (microns) |
|---|---|---|---|---|
| 1 | Sn or Sn—Bi | cold gas spray | 12.7 | 76.2 |
| 2 | Ni | cold gas spray | 12.7 | 76.2 |
| 3 | Kovar Alloy | cold gas spray | 635 | 2,540 |

After the deposition of the metal layers using the cold gas dynamic spray deposition, it may be necessary to grind or shape the top surface of the built-up frame 1212 to a predetermined flatness before performing additional steps to ensure that a good contact will be made in later bonding. Another process which may be used, either alone or in combination with shaping the top surface of the built-up frame, is the depositing of additional metal layers onto the built-up frame/heat spreader 1212 using solution bath plating. The most common reason for such plated layers is to promote a good bonding when the frame/heat spreader is adjoined to the package base 104. In a preferred embodiment, the additional metallic layers applied to the built-up frame 1212 include a layer of nickel directly over the cold gas dynamic spray deposited metal having a thickness within the range of about 0.002 microns to about 25 microns and then solution bath plating a layer of gold over the nickel layer until the gold layer has a thickness within the range from about 0.0508 microns to about 0.508 microns.

Referring now to FIG. 14, there is illustrated a block diagram of the alternative embodiment utilizing cold gas dynamic spray deposition. It will be appreciated that, unless specifically noted otherwise, the initial steps of obtaining a transparent sheet having finished surfaces, applying surface treatments to the sheet, cleaning, roughening or otherwise preparing the frame attachment area of the sheet are substantially identical to those described for the previous embodiments and will not be described in detail again. For example, block 1402 of FIG. 14 represents the step of obtaining a sheet of transparent material having finished surfaces and corresponds directly with block 902, and with the description of suitable transparent materials. Similarly, except as noted, blocks 1404, 1406 and 1408 of FIG. 14 correspond directly with blocks 904, 906 and 908, respectively, of FIG. 9 and with the previous descriptions of the steps and sub-steps provided herein. Thus, it will be understood that all of the options described for performing the various steps and sub-steps represented by the blocks 902-908 in the previous (i.e., prefabricated frame) embodiments are applicable to the blocks 1402-1408 in the current (i.e., cold spray) embodiment.

The next step of the process is to use cold gas dynamic spray deposition to deposit frame/heat spreader metal onto any previously deposited metal layers in the frame attachment area 1200. This step is represented by block 1410. As previously described in connection with FIGS. 13b and 13c, the high velocity particles 1306 from the gas nozzle 1304 form a new layer on the previous metallic layers, and by directing the cold spray jet across the frame attachment area 1200 repeatedly, the new material can become a continuous metallic layer around the entire periphery of the frame attachment area, i.e., it will circumscribe the window portion 312 of the transparent sheet 304. Where the material of the package base 104 (to which the cover assembly 1210 will eventually be joined) is Kovar alloy or appropriately metallized alumina, Kovar alloy is preferred for the material 1206 to be cold sprayed to form the integral frame. In other cases, a heat spreader material must be selected which has a CTE that is closely matched to the CTE of the package base 104. Of course, that material must also be compatible with the cold gas dynamic spray process.

The cold spraying of the powdered heat spreader material is continued until the new layer 1206 reaches the thickness required to serve as a heat spreader/integral frame. This would represent the end of the process represented by block 1410. It will be appreciated that there are flatness requirements for the sealing surface at the top of the heat spreader (which is actually on the bottom surface 316 of the sheet). If these flatness requirements are not met via the application of the heat spreader material by the cold spray process, it will be necessary to flatten the sealing surface at the next step of the process. This step is represented by block 1412 in FIG. 14. There are a number of options for achieving the required surface flatness. First, it is possible to remove surface material from the heat spreader to achieve the required flatness. This may be accomplished by conventional surface grinding, by other traditional mechanical means, or it may be accomplished by the laser removal of high spots. Where material removal is used, care must be taken to avoid damaging the finished window surfaces 314 and 316 during the material removal operations. Special fixturing and/or masking of the window portion 312 may be required. Alternatively, if the cold spray deposited heat spreader 1212 is ductile enough, the surface may be flattened using a press operation, i.e., pressing the frame against a flat pattern. This would reduce the handling precautions as compared to using a surface grinder or laser operations.

Finally, as previously described, in some embodiments additional metal layers are plated onto the integral frame/heat spreader. These operations, such as solution bath plating layers of nickel and gold onto a Kovar alloy frame, are represented by block 1414 in FIG. 14.

Referring now to FIGS. 15a and 15b, there is illustrated a method for manufacturing multiple cover assemblies simultaneously in accordance with another embodiment of the current invention. Shown in FIG. 15a is an exploded view of a multi-unit assembly which can be subdivided after fabrication to produce individual cover assemblies. The multi-unit assembly 1500 includes a frame 1502 and a sheet 1504 of a transparent material. The frame 1502 has sidewalls 1506 defining a plurality of frame apertures 1508 there through. Each frame aperture 1508 is circumscribed by a continuous sidewall section having a frame seal-ring area 1510 (denoted by cross-hatching). Each frame seal-ring area 1510 has a metallic surface, which may result from the inherent material of the frame 1502 or it may result from metal layers which have been applied to the surface of the frame. In some embodiments, the frame 1502 includes reduced cross-sectional thickness areas 1509 formed on the frame sidewalls 1506 between adjacent frame apertures 1508. FIG. 15b shows the bottom side of the frame 1502, to better illustrate the reduced cross-sectional thickness areas 1509 formed between each aperture 1508. Also illustrated is the base seal-ring area 1520 (denoted by cross-hatching) which surrounds each aperture 1508 to allow joining to the package bases 104.

Except for the details just described, the multiple-aperture frame 1502 of this embodiment shares material, fabrication and design details with the single aperture frame 302 previously described. In this regard, a preferred embodiment of the frame 1502 is primarily formed of Kovar alloy or similar materials and more preferably, will have a Kovar alloy core with a surface layer of gold overlaying an intermediate layer of nickel as previously described.

The transparent sheet 1504 for the multi-unit assembly can be formed from any type of transparent material as previously discussed for sheet 304. In this embodiment, however, the sheet 1504 has a plurality of window portions 1512 defined thereupon, with each window portion having finished top and bottom surface 1514 and 1516, respectively. A plurality of sheet seal-ring areas 1518 are denoted by cross-hatching surrounding each window portion in FIG. 15a. With respect to the material of the sheet 1504, with respect to the finished configuration of the top and bottom surfaces 1514 and 1516, respectively, of each window portion 1512, with respect to surface treatments, and/or coatings, the sheet 1504 is substantially identical to the single window portion sheet 304 previously discussed.

The next step of the process of manufacturing the multi-unit assembly 1500 is to prepare the sheet seal-ring areas 1518 for metallization. As noted earlier, each sheet seal-ring area 1518 circumscribes a window portion of the sheet 1504. The sheet seal-ring areas 1508 typically have a configuration which closely matches the configuration of the frame seal-ring areas 1510 to which they will eventually be joined. It will be appreciated, however, that in some cases other considerations will affect the configuration of the frame grid, e.g., when electrical resistance heating is used to produce bonding, then the seal-ring areas 1518 must be connected to form the appropriate circuits. The steps of preparing the sheet seal-ring areas 1518 for metallization is substantially identical to the steps and options presented during discussion of preparing the frame seal-ring area 310 on the single aperture frame 302. Thus, at a minimum, preparing the sheet seal-ring area 1518 involves a thorough (e.g., plasma) cleaning to remove any contaminants from the surfaces and typically also involves roughening the seal-ring area by chemical etching, laser ablating, mechanical grinding or sandblasting this area.

The step of metallizing the prepared sheet seal-ring areas 1510 of the sheet 1502 are substantially identical to the steps described for metallizing the frame seal-ring area 310 on the single aperture frame 302. For example, the metal layers shown in Examples 1 through 8 can be used in connection with thermal compression bonding, the metal layers of Examples 9 through 20 can be used for soldering where the solder material is plated onto the sheet as a final metallic layer, the metal layer configurations of Examples 21 through 32 can be used in connection with soldering in combination with a separate gold-tin of solder preform and also for soldering in connection with solders deposited or formed using inkjet technology.

The next step of the process is to position the frame 1502 against the sheet 1504 (it being understood that solder preforms or solder layers would be interposed between the frame and the sheet) such that each of the window portions 1512 overlays one of the frame apertures 1508, and that for each such window portion/frame aperture combination, at least a portion of the associated frame seal-ring area 1510 and at least a portion of the associated sheet seal-ring area 1518 contact one another along a continuous junction region that circumscribes the associated window portion. This operation is generally analogous to the steps of positioning the frame against the sheet in the single aperture embodiment previously described.

Referring now to FIG. 16*a*, there is illustrated the positioning of a multi-window sheet 1504 (in this case having window portions 1512 with contoured surfaces) against a multi-aperture frame 1502 using compliant tooling in accordance with another embodiment. The compliant tooling includes a compliant element 1650 and upper and lower support plates 1652, 1654, respectively. The support plates 1652 and 1654 receive compressive force, denoted by arrows 1656, at discrete locations from tooling fixtures (not shown). The compliant member 1650 is positioned between one of the support plates and the cover assembly pre-fab (i.e., frame 1502 and sheet 1504). The compliant member 1650 yields elastically when a force is applied, and therefore can conform to irregular surfaces (such as the sheet 1504) while at the same time applying a distributed force against the irregular surface to insure that the required contact pressure is achieved all along the frame/sheet junction. Such compliant tooling can also be used to press a sheet or frame against the other member when the two members are not completely flat, taking advantage of the inherent flexibility (even if small) present in all materials. In the illustrated example, the compliant member 1650 is formed from a solid block of an elastomer material, e.g., rubber, however in other embodiments the compliant member may also be fabricated from discrete elements, e.g., springs.

The next step of the process is heating all of the junction regions until a metal-to-metal joint is formed between the frame 1502 and the sheet 1504 all along each junction region, thus creating the multi-unit assembly 1500 having a hermetic frame/sheet seal circumscribing each window portion 1512. It will be appreciated that any of the heating technologies previously described for joining the single aperture frame 302 to the single sheet 304 are applicable to joining the multi-aperture frame 1502 to the corresponding multi-window sheet 1504.

Referring now to FIG. 16*b*, the final step of the current process is to divide the multi-unit assembly 1500 along each junction region that is common between two window portions 1512 taking care to preserve and maintain the hermetic seal circumscribing each window portion. A plurality of individual cover assemblies are thereby produced. FIG. 16*b*, illustrates a side view of a multi-unit assembly 1500 following the hermetic bonding of the sheet 1504 to the frame 1502. Where the frame 1502 includes reduced cross-sectional thickness areas 1509, the step of dividing the multi-unit assembly may include scoring the frame along the back side of the reduced cross-sectional thickness area at the position indicated by arrow 1602, preferably breaking through or substantially weakening the remaining frame material below area 1509, and also simultaneously scoring the sheet 1504 along a line vertically adjacent to area 1509, i.e., at the point indicated by arrow 1604, followed by flexing the assembly 1500, e.g., in the direction indicated by arrows 1606 such that a fracture will propagate away from the score along line 1608, thereby separating the assembly into two pieces. This procedure can be repeated along each area of reduced cross-sectional thickness 1509 until the multi-unit assembly 1500 has been completely subdivided into single aperture cover assemblies that are substantially identical to those produced by the earlier method described herein. In other embodiments, instead of using the score-and-break method, the cover assemblies may be cut apart, preferably from the frame side along the path indicated by arrow 1602 (i.e., between the window portions 1512), using mechanical cutting, laser, water jet or other parting technology.

Referring now to FIGS. 17*a* and 17*b*, there is illustrated yet another method for simultaneously manufacturing multiple cover assemblies. This method expands upon the cold gas dynamic spray technique used to build an integral frame/heat spreader directly upon the transparent sheet material as previously illustrated in connection with FIGS. 12*a* through 12*c* and FIGS. 13*a* through 13*c*. As shown in FIG. 17*a*, the process starts with a sheet of nonmetallic transparent material 1704 having a plurality of window portions 1712 defined thereupon, each window portion having finished top and bottom surfaces 1714 and 1716, respectively. The properties and characteristics of the transparent sheet 1704 are substantially identical to those in the embodiments previously discussed. The next step of the process involves preparing a plurality of frame attachment areas 1720 (denoted by the path of the broken line surrounding each window portion 1712), each frame attachment area 1720 circumscribing one of the window portions 1712. As in previous embodiments, the step of preparing the frame attachment areas may comprise cleaning, roughening, grinding or otherwise modifying the frame attachment areas in preparation for metallization.

The next step in this process is metallizing the prepared frame attachment areas on the sheet, i.e., this metallization may be performed using a cold gas dynamic spray technology or where the layers are relatively thin, using a CVD, physical vapor deposition or other conventional metal deposition techniques. It will be appreciated that the primary purpose of this step is to apply metal layers necessary to obtain good adhesion to the transparent sheet 1704 and/or to meet the metallurgical requirements for corrosion prevention, etc.

Referring now to FIG. 17*b*, the next step of the process is depositing metal onto the prepared/metallized frame attachment areas of the sheet 1704 using cold gas dynamic spray deposition techniques until a built-up metal frame 1722 is formed upon the sheet having a seal-ring area 1726 that is a predetermined vertical thickness above the frame attachment areas, thus creating a multi-unit assembly having an inherent hermetic seal between the frame 1722 and the sheet 1704 circumscribing each window portion 1712. In some embodiments, reduced cross-sectional thickness areas 1724 are formed by selectively depositing the metal during the cold spray deposition. In other embodiments, the reduced cross-sectional area sections 1724 may be formed following deposition of the frame/heat spreader 1722 through the use of grinding, cutting or other mechanical techniques such as laser ablation and water jet.

The next step of the process which, while not required is strongly preferred, is to flatten, if necessary, the seal-ring area 1726 of the sprayed-on frame 1722 to meet the flatness requirements for joining it to the package base 104. This flattening can be accomplished by mechanical means, e.g., grinding, lapping, polishing, etc., or by other techniques such as laser ablation.

The next step of the process, which, while not required, is strongly preferred, is to add additional metallic layers, e.g., a nickel layer and preferably also a gold layer, to the seal-ring area 1726 of the sprayed-on frame 1722 to facilitate welding the cover assembly to the package base 104. These metallic layers are preferably added using a solution bath plating process, e.g., solution bath plating, although other techniques may be used.

The next step of the process is dividing the multi-unit assembly 1700 along each frame wall section common between two window portions 1712 while, at the same time, preserving and maintaining the hermetic seal circumscribing each window portion. After dividing the multi-unit 1700, a plurality of single aperture cover assemblies 1728 (shown in broken line) will be produced, each one being substantially identical to the single aperture cover assemblies produced using the method described in FIGS. 12a through 12c and FIGS. 13a through 13c. All of the options, characteristics and techniques described for use in the single unit cover assembly produced using cold gas dynamic spray technology are applicable to this embodiment. It will be appreciated that certain operations for example, the flattening of the frame and the plating of the frame with additional metallic layers, may be performed on the multi-unit assembly 1700, prior to separation of the individual units, or on the individual units after separation.

As previously described, heating the junction region between the metallized seal-ring area of the transparent sheet and the seal-ring area of the frame is required for forming the hermetic seal there between. Also as previously described, this heating may be accomplished using a furnace, oven, or various electrical heating techniques, including electrical resistance heating (ERH). Referring now to FIGS. 18a-18c, there is illustrated methods of utilizing electric resistance heating to manufacture multiple cover assemblies simultaneously.

Referring first to FIG. 18a, there is illustrated a transparent sheet 1804 having a plurality of seal-ring areas 1818 laid out in a rectangular arrangement around a plurality of window portions 1812. These seal-ring areas 1818 have been first prepared, and then metallized with one or more metal or metal alloy layers, as previously described herein. The transparent sheet 1804 further includes an electrode portion 1830 which has been metallized, but does not circumscribe any window portions 1812. This electrode portion is electrically connected to the metallized seal-ring areas 1818 of the sheet. One or more electrode pads 1832 may be provided on the electrode portion 1830 to receive electrical energy from electrodes during the subsequent ERH procedure.

Referring now to FIG. 18b, there is illustrated a frame 1802 having a plurality of sidewalls 1806 laid out in a rectangular arrangement around a plurality of frame apertures 1808. The apertures 1808 are disposed so as to correspond with the positions of the window portions 1812 of the sheet 1804, and the sidewalls 1806 are disposed so that frame seal-ring areas 1810 (located thereupon) correspond with the positions of the sheet seal-ring areas 1818 of the sheet. The frame is metallic or metallized in order to facilitate joining as previously described herein. The frame 1802 further includes an electrode portion 1834 that does not circumscribe any frame apertures 1808. This frame electrode portion 1834 is positioned so as not to correspond to the position of the sheet electrode portion 1830, and preferably is disposed on an opposing side of the sheet-window/frame-grid assembly (i.e., when the sheet is assembled against the frame). The frame electrode portion 1834 is electrically connected to the metallized frame seal-ring areas 1810. One or more electrode pads 1836 may be provided on the electrode portion 1834 to receive electrical energy from electrodes during the subsequent ERH procedure.

Referring now to FIG. 18c, the sheet 1804 is shown positioned against the frame 1802 in preparation for heating to produce the hermetic seal there between. If applicable, solder or a solder preform has been positioned there between as previously described. It will be appreciated that when the transparent sheet 1804 is brought against the frame 1802, the metallized seal-ring areas 1818 on the lower surface of the sheet will be in electrical contact with the metallized seal-ring areas 1810 on the upper surface of the frame. However, the sheet electrode portion 1830 and the frame electrode portion 1834 will not be in direct contact with one another, but instead will be electrically connected only through the metallized seal-ring areas 1818 and 1810 to which they are, respectively, electrically connected. When an electrical potential is applied from electrode pads 1832 to electrode pads 1834 (denoted by the "+" and "−" symbols adjacent to the electrodes), electrical current flows through the junction region of the entire sheet-window/frame-grid assembly. This current flow produces electrical resistance heating (ERH) due to the resistance inherent in the metallic layers. In some embodiments, this electrical resistance heating may be sufficient, in and of itself, to result in TC bonding, soldering, or other hermetic seal formation between the sheet 1804 and the frame 1802 in order to form a multi-unit assembly. In other embodiments, however, electrical resistance heating may be combined with other heating forms such as furnace or oven pre-heating in order to supply the necessary heat required for bonding to form the multi-unit assembly.

After bonding the sheet 1804 to the frame 1802 to form the multi-unit assembly, the sheet electrode portion 1830 and the frame electrode portion 1834 can be cut away and discarded, having served their function of providing electrical access for external electrodes (or other electrical supply members) to the metallized seal-ring areas of the sheet and frame, respectively. The removal of these "sacrificial" electrode portions 1830 and 1834 may occur before or during the "dicing" process step, i.e., the separating of the multi-unit assembly into individual cover assemblies. It will be appreciated that any of the technologies previously described herein for separating a multi-unit assembly into individual cover assemblies can be used for the dicing step of separating a multi-unit assembly fabricated using ERH heating.

Where ERH is to be used for manufacturing multiple cover assemblies simultaneously, the configuration of the sheet-window/frame-grid array and/or the placement of the electrodes portions within the sheet-window/frame-grid array may be selected to modify the flow of current through the junction region during heating. The primary type of modification is to even the flow of current through the various portions of the sheet-window/frame-grid during heating to produce more even temperatures, i.e., to avoid "hot spots" or "cold spots."

Referring now to FIGS. 19a-19f, there are illustrated various sheet-window/frame-grid configurations adapted for producing more even temperatures during ERH. In each of FIGS. 19a-19f, there is shown a sheet-window/frame-grid array 1900 comprising a prepared, metallized transparent sheet 1904 overlying a prepared, metallic/metallized frame 1902. The window portions of the sheet 1904 directly overlie the frame apertures of the frame 1902, and the metallized seal-ring areas of the sheet directly overlie the seal-ring areas of the frame (it will be appreciated that metallized portions of the sheet 1904 and the frame 1902 appear coincident in these figures). Metallized electrode portions formed on the transparent sheet 1904 are denoted by reference letters A, B, C and D. These electrode portions A, B, C and D are electrically connected to the adjoining sheet seal-ring areas of the sheet, but are electrically insulated from one another by non-metallized areas 1906 of the sheet. An external electrode is applied to the top of the metallic/metallized frame (on the side opposite from the sheet) across the area denoted by reference letter E. For bonding or soldering, electrical power is applied at the electrodes, e.g., one line to electrodes A, B, C and D simultaneously, and the other line to electrode E, or alternatively, one line in sequence to each of electrode A, B, C and D, and the other line to electrode E. It will be appreciated that many other combinations of electrode powering are within the scope of the invention.

Figure 19A:
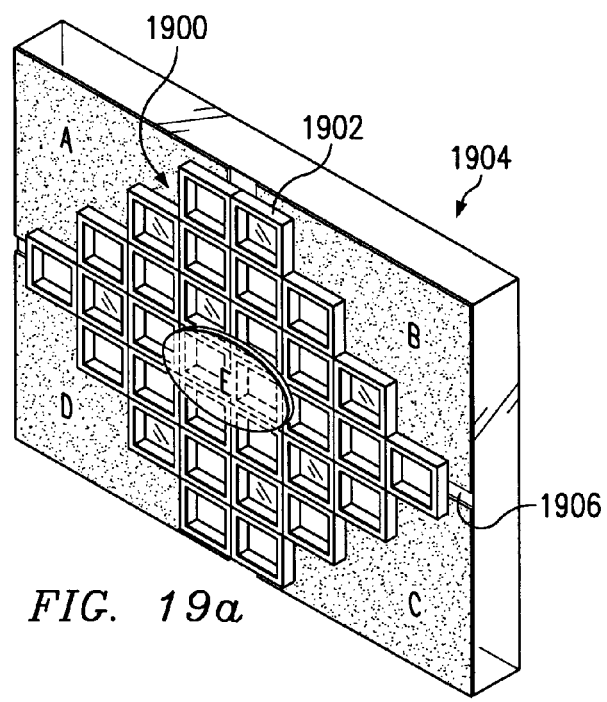
Figure 19B:
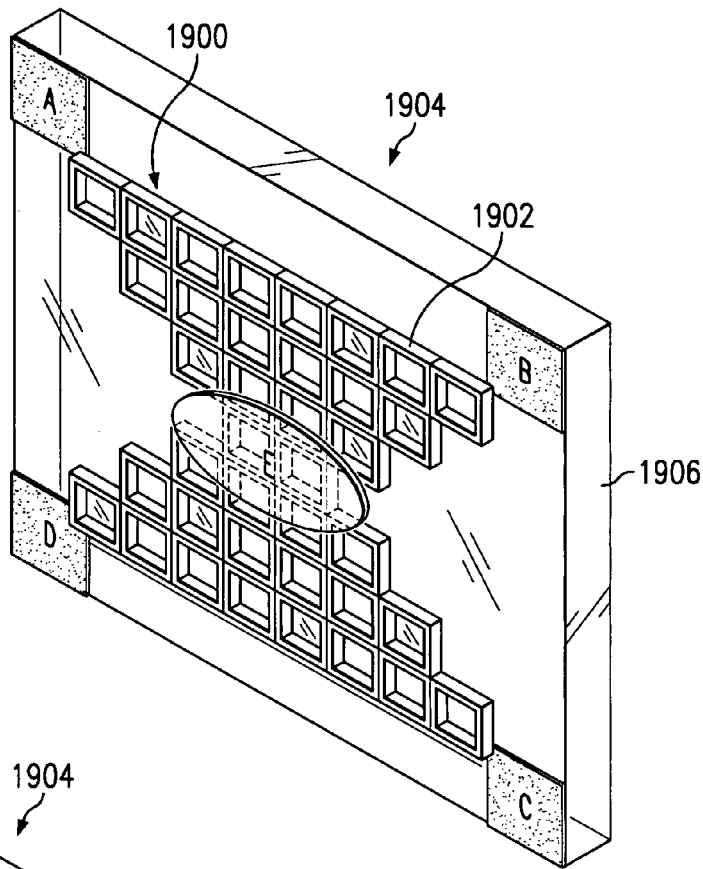
Figure 19C:
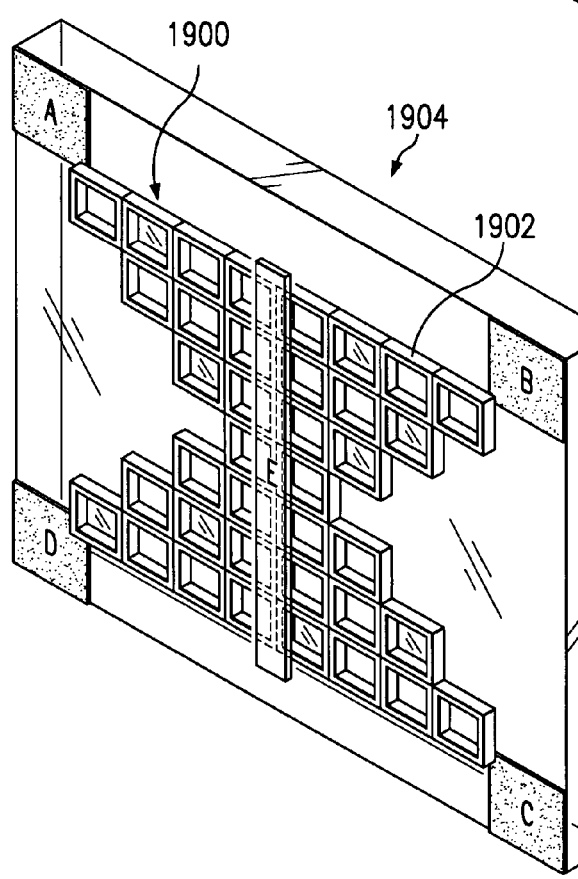
Figure 19D:
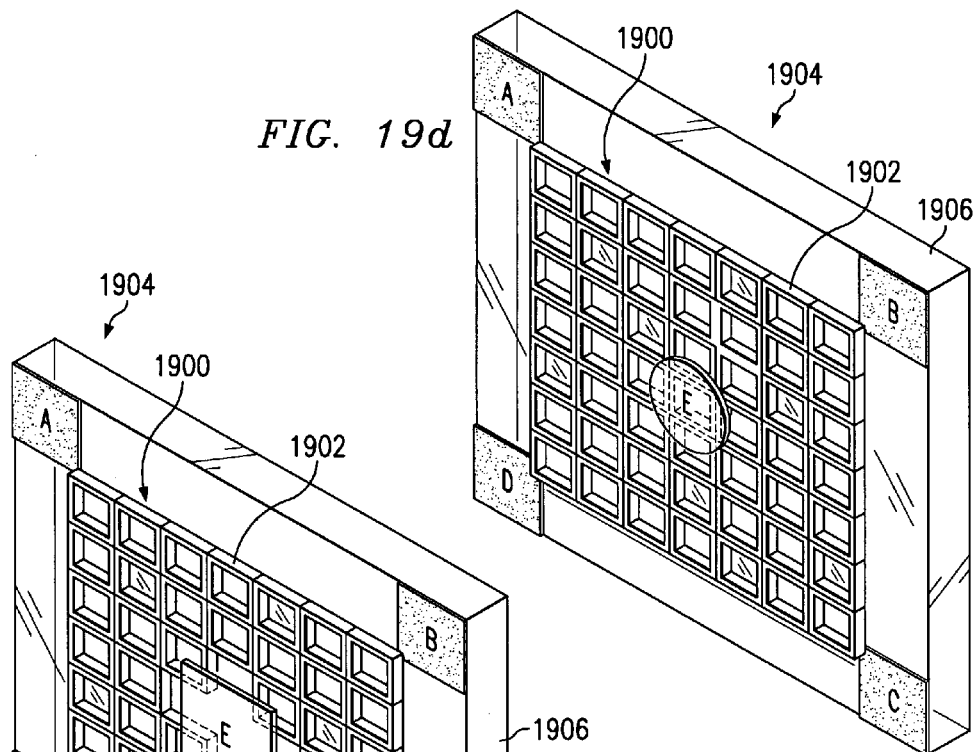
Figure 19E:
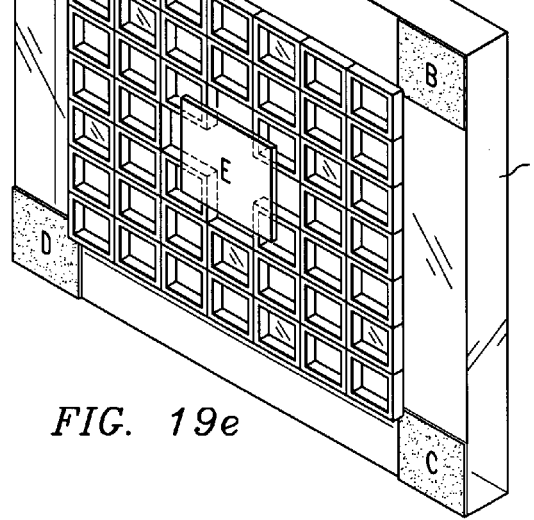
Figure 19F:
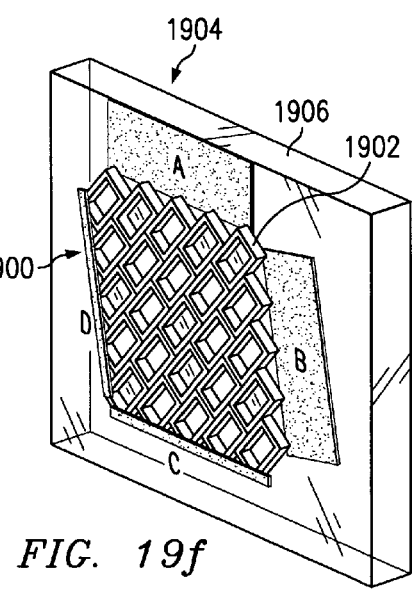

Referring to FIG. 19f, this embodiment illustrates a sheet-window/frame-grid 1900 having a "shingle" configuration, i.e., where the seal-ring areas between the window portions/frame apertures do not form continuous straight lines across the assembly array. Shingle-arrangement frame assemblies are more labor-intensive to separate using scribe-and-break or cutting procedures. Separating such assemblies requires that each row first be separated from the overall grid, and then that individual cover assemblies be separated from the row by separate scribe-and-break or cutting operations. Nevertheless, use of shingle-arrangement assemblies may have benefits relating to heating using ERH techniques.

While the invention has been shown or described in a variety of its forms, it should be apparent to those skilled in the art that it is not limited to these embodiments, but is susceptible to various changes without departing from the scope of the invention.

What is claimed is:

1. A method for manufacturing a cover assembly that can be hermetically attached to a micro-device package base to form a hermetically sealed micro-device package, the cover assembly including a transparent window portion and a frame, the method comprising the following steps:

providing a frame including a frame seal-ring area circumscribing the periphery of the frame;

providing a sheet of a transparent material having a window portion defined thereupon with a sheet seal-ring area circumscribing the window portion;

positioning the frame against the sheet such that at least a portion of the frame seal-ring area and at least a portion of the sheet seal-ring area contact one another along a junction region that circumscribes the window portion;

pressing the frame against the sheet with sufficient force to produce a predetermined contact pressure between the frame seal-ring area and the sheet seal-ring area along the junction region;

heating the junction region to produce a predetermined temperature along the junction region; and maintaining the predetermined contact pressure and the predetermined temperature until a diffusion bond is formed between the frame and sheet along a substantial portion of the junction region.

2. A method in accordance with claim 1, wherein the step of pressing the frame is performed before the step of heating the junction.

3. A method in accordance with claim 1, wherein the step of heating the junction is performed before the step of pressing the frame.

4. A method in accordance with claim 1, wherein the steps of pressing the frame and of heating the junction are performed simultaneously.

5. A method in accordance with claim 1, wherein the transparent material of the sheet is a glass.

6. A method in accordance with claim 1, wherein the transparent material of the sheet is a crystalline material.

7. A method in accordance with claim 6, wherein the crystalline material is quartz.

8. A method in accordance with claim 6, wherein the crystalline material is sapphire.

9. A method in accordance with claim 1, wherein the transparent material of the sheet is a polymeric material.

10. A method in accordance with claim 9, wherein the polymeric material is a polycarbonate plastic.

11. A method in accordance with claim 1, wherein the frame is primarily formed of an alloy having a nominal chemical composition of 54% iron (fe), 29% nickel (Ni) and 17% cobalt (Co).

12. A method in accordance with claim 11, wherein the alloy is ASTM F-15 alloy.

13. A method in accordance with claim 11, wherein the alloy is Kovar alloy.

14. A method in accordance with claim 1, wherein during the step of heating the junction region, the temperature of the window portion of the sheet remains below the glass transition temperature ($T_g$) of the transparent material.

15. A method in accordance with claim 1, wherein the step of providing a sheet of transparent material further includes applying a surface treatment to the sheet.

* * * * *

UNITED STATES PATENT AND TRADEMARK OFFICE
CERTIFICATE OF CORRECTION

| | | |
|---|---|---|
| PATENT NO. | : 7,238,546 B2 | Page 1 of 1 |
| APPLICATION NO. | : 10/880166 | |
| DATED | : July 3, 2007 | |
| INVENTOR(S) | : David H. Stark | |

It is certified that error appears in the above-identified patent and that said Letters Patent is hereby corrected as shown below:

Col. 1, line 16, please insert the following paragraph: --This invention was made with government support under Contract No. DE-FC26-06NT42765 awarded by the Department of Energy. The Government has certain rights in this invention.--

Signed and Sealed this

Twenty-ninth Day of January, 2013

David J. Kappos
*Director of the United States Patent and Trademark Office*